US007209843B2

(12) United States Patent
Kodate et al.

(10) Patent No.: US 7,209,843 B2
(45) Date of Patent: Apr. 24, 2007

(54) CIRCUIT INSPECTION METHOD, METHOD OF MANUFACTURING LIQUID-CRYSTAL DISPLAY, AND CIRCUIT INSPECTION APPARATUS

(75) Inventors: Manabu Kodate, Yokohama (JP); Tomoyuki Taguchi, Kusatsu (JP)

(73) Assignees: International Business Machines Corporation, Armonk, NY (US); CMO Japan Co., Ltd., Tokyo (JP)

( * ) Notice: Subject to any disclaimer, the term of this patent is extended or adjusted under 35 U.S.C. 154(b) by 0 days.

(21) Appl. No.: 11/120,942

(22) Filed: May 4, 2005

(65) Prior Publication Data

US 2005/0278128 A1 Dec. 15, 2005

(30) Foreign Application Priority Data

May 10, 2004 (JP) .............................. 2004-140266

(51) Int. Cl.
*G06F 19/00* (2006.01)
*G01R 19/00* (2006.01)
*G01R 31/00* (2006.01)

(52) U.S. Cl. ........................................ 702/64; 324/770

(58) Field of Classification Search .................. 702/63, 702/64

See application file for complete search history.

(56) References Cited

U.S. PATENT DOCUMENTS 6,930,505 B2 * 8/2005 Taguchi et al. ............. 324/770

FOREIGN PATENT DOCUMENTS

| | | | |
|---|---|---|---|
| JP | 2002-074999 | * | 3/2002 |
| JP | 2002-196357 | A | 7/2002 |
| JP | 2003-330034 | A | 11/2003 |

* cited by examiner

*Primary Examiner*—Michael Nghiem
(74) *Attorney, Agent, or Firm*—Sughrue Mion, PLLC

(57) ABSTRACT

A circuit inspection method includes supplying electric charges to a first, second, and third electric charge holding electrodes in an electric circuit; outputting the electric charges held in the first electric charge holding electrode after a predetermined period of time from supplying of the electric charges; changing voltages of the first and second scan lines to a drive voltage to output the electric charges held in the second electric charge holding electrode; and determining whether an electric charge writing function and an electric charge holding function of the second electric charge holding electrode are good or not based on a quantity of the supplied electric charges and a quantity of the electric charges output from the second electric charge holding electrode.

13 Claims, 14 Drawing Sheets

CIRCUIT INSPECTION METHOD, METHOD OF MANUFACTURING LIQUID-CRYSTAL DISPLAY, AND CIRCUIT INSPECTION APPARATUS

BACKGROUND OF THE INVENTION

1. Field of the Invention

The present invention relates to a circuit inspection apparatus for an electric circuit formed on an array substrate which employs a multiple pixel structure and an electric circuit equivalent to the electric circuit, and a method of manufacturing a liquid crystal display which employs the circuit inspection method and the multiple pixel structure.

2. Description of the Related Art

As a liquid crystal display, an active matrix liquid crystal display using a TFT (Thin Film Transistor) as a switching device is known. In the active matrix liquid crystal display, a liquid crystal material is sealed between a TFT array substrate on which scan lines and data lines are arranged in the form of a matrix and thin film transistors are arranged at crossing points between both the lines and a counter substrate arranged spaced apart from the TFT array substrate with a predetermined interval, a voltage to be applied to the liquid crystal material is controlled by the thin film transistors, so that a display can be achieved by using the electro-optic effect of liquid crystal. The ON/OFF-operations of the thin film transistors are controlled by voltages applied by the scan lines and the data lines. The scan lines and the data lines are connected to drive circuits, respectively.

In consideration of a tendency to improve definition of a recent liquid crystal displays, the number of data lines and the number of scan lines increase with an increase in number of pixels, and the number of drive ICs tends to increase. Since this tendency causes an increase in manufacturing cost and a decrease in yield, a structure (to be referred to as a "multiple pixel structure" hereinafter) in which a voltage is applied to a pixel electrode group belonging to a plurality of columns by one data line to reduce the number of data lines and the number of drive ICs to be connected to the data lines is proposed.

FIG. 14 is an equivalent circuit diagram showing an example of a structure of a TFT array substrate constituting a liquid crystal display having the multiple pixel structure. As shown in FIG. 14, for example, a pixel electrode A1 is connected to a scan line Gn+1 and a scan line Gn+2 through a first thin film transistor M1 and a second thin film transistor M2. A display signal is supplied from a data line Dm to the pixel electrode A1. A pixel electrode B1 is connected to the scan line Gn+1 through a third thin film transistor M3. Similarly, a display signal is supplied from the data line Dm to the pixel electrode B1. The other pixel electrodes are connected to the same circuit structures to sequentially supply the pixel electrodes A1, B1, C1, and D1 and display signals from the same data line Dm, thereby displaying an image. By employing the structure, as shown in FIG. 14, the number of data lines can be reduced. Consequently, the number of drive ICs connected to the data lines can be reduced. For this reason, an advantage of being able to reduce manufacturing cost can be achieved (For example, see Japanese Patent Application Laid-Open Nos. 2002-196357 and 2003-330034).

In general liquid crystal display, gradation displays on each display pixel are performed depending on quantities of electrical charge accumulated in pixel electrodes respectively arranged on the display pixels. Therefore, from a viewpoint of keeping quality of display image characteristics, it is important that appropriate charges are supplied to the pixel electrodes depending on display gradations and that the supplied charges are held for a predetermined period of time. In an inspection, performed in manufacturing steps, of a circuit structure formed on an array substrate, an electric charge writing function and an electric charge holding function especially related to pixel electrodes are intensively inspected.

A conventional inspection method related to a circuit structure formed on an array substrate is as follows. In general, as in an image display, thin film transistors corresponding to pixel electrodes are turned on, and known electric charges are supplied by data lines through the ON thin film transistors. A predetermined period of time after, the thin film transistors are turned on again, and charges held in the pixel electrodes are output outside through the data lines. For example, a value of charges in supplying is compared with a value of charges in outputting to determine whether the circuit structure of each display pixel is good or not.

It is desired that an inspection for a circuit structure be performed to all display pixels. For this reason, in a conventional inspection method, after predetermined electric charges are supplied to the pixel electrodes as in image display, the scan lines are sequentially scanned as in the image display to extract electric charges, thereby determining whether the display pixels are good or not.

However, a liquid crystal display which employs the multiple pixel structure, a defective pixel cannot be easily specified when an inspection is performed to circuit structures formed on an array substrate. This problem will be described below in detail.

As also shown in FIG. 14, the liquid crystal display which employs the multiple pixel structure has a structure in which the pixel electrode A1 is electrically connected to the data line Dm when the first thin film transistor M1 and the second thin film transistor M2 are turned on. Therefore, when electric charges accumulated in the pixel electrode A1 are output outside, the scan line Gn+1 and the scan line Gn+2 in FIG. 14 must supply voltages (to be referred to as "drive voltages" hereinafter) required to drive thin film transistors to turn on the first thin film transistor M1 and the second thin film transistor M2.

On the other hand, the third thin film transistor M3 arranged for the pixel electrode B1, as also shown in FIG. 14, has a configuration in which a gate electrode is connected to the scan line Gn+1. Therefore, when the drive voltage is supplied by the scan line Gn+1, the third thin film transistor M3 is also controlled in an ON state. The moment the pixel electrode A1 and the data line Dm are electrically connected to each other, the pixel electrode B1 and the data line Dm are electrically connected to each other.

A thin film transistor corresponding to the pixel electrode D1 has a structure in which a gate electrode is electrically connected to the scan line Gn+2. Therefore, when the scan line Gn+2 supplies a drive voltage to output charges accumulated in the pixel electrode A1 outside through the data line Dm, at the same time, the pixel electrode D1 and the data line Dm are electrically connected to each other.

As described above, when the pixel electrode A1 and the data line Dm are electrically connected to each other to output the accumulated electric charges outside, the pixel electrode B1 and the pixel electrode D1 are also consequently electrically connected to the data line Dm. Therefore, when the liquid crystal display which employs the multiple pixel structure is to be inspected, not only electric charges accumulated in the pixel electrode A1 but also electric charges accumulated in the pixel electrodes B1 and D1 are output outside through the data line Dm, so that only a sum of electric charges accumulated in the plurality of pixel electrodes can be recognized. It is very difficult to accurately determine whether the circuit structure is good or not.

The present invention was made to solve the above-mentioned problems and has an object of realizing a technique which can accurately detect quantities of electric charges held in a plurality of electric holding electrodes such as pixel electrodes, like an electric circuit formed on an array substrate for a liquid crystal display employed a multiple pixel structure.

SUMMARY OF THE INVENTION

A circuit inspection method according to one aspect of the present invention includes: supplying electric charges to a first, second, and third electric charge holding electrodes, the first electric charge holding electrode being electrically connected to an output line when a predetermined drive voltage is supplied to a first scan line, the second electric charge holding electrode being electrically connected to the output line when a predetermined drive voltage is supplied to both the first scan line and a second scan line, the third electric charge holding electrode being electrically connected to the output line when a predetermined drive voltage is supplied to the second scan line; outputting the electric charges held in the first electric charge holding electrode after a predetermined period of time from supplying of the electric charges; changing voltages of the first and second scan lines to a drive voltage to output the electric charges held in the second electric charge holding electrode; and determining whether an electric charge writing function and an electric charge holding function of the second electric charge holding electrode are good or not based on (i) one of a quantity of the electric charges supplied to the second electric charge holding electrode and a quantity corresponding to the electric charges supplied to the second electric charge holding electrode, and (ii) a quantity of the electric charges output from the second electric charge holding electrode.

In this case, the “quantity corresponding to the supplied electric charge” means a quantity related to substitutional characteristics such as a quantity of average output electric charge of other electrodes.

A circuit inspection method according to another aspect of the present invention includes: detecting and storing electric charges of at least one of a first electric charge holding electrode and a third electric charge holding electrode, the first electric charge holding electrode being electrically connected to an output line when a predetermined drive voltage is supplied to a first scan line, the third electric charge holding electrode being electrically connected to the output line when a predetermined drive voltage is supplied to a second scan line; supplying predetermined electric charges to a second electric charge holding electrode and at least one of the first electric charge holding electrode and the third electric charge holding electrode, the second electric charge holding electrode being electrically connected to the output line when a predetermined drive voltage is supplied to both the first scan line and the second scan line; changing voltages of the first and second scan lines into a drive voltage after a predetermined period of time from supplying of the predetermined electric charges to drive switching devices and to output the electric charges held in the second electric charge holding electrode and the at least one of the first electric charge holding electrode and the third electric charge holding electrode; and determining an electric charge writing function and an electric charge holding function of the second electric charge holding electrode based on (i) the stored electric charges, (ii) the output electric charges, and (iii) one of a quantity of the supplied electric charges and a quantity corresponding to the supplied electric charges.

A method of manufacturing a liquid crystal display according to still another aspect of the present invention includes: forming an electric circuit including a predetermined substrate, an output line, first and second scan lines, a first electric charge holding electrode which is electrically connected to the output line when a predetermined drive voltage is supplied to the first scan line, a second electric charge holding electrode which is electrically connected to the output line when a predetermined drive voltage is supplied to both the first and second scan lines, and a third electric charge holding electrode which is electrically connected to the output line when a predetermined drive voltage is supplied to the second scan line; supplying electric charges to the first, second, and third electric charge holding electrodes; outputting the electric charges held in the first electric charge holding electrode after a predetermined period of time from supplying of the electric charges; changing voltages of the first and second scan lines to a drive voltage to output the electric charges held in the second electric charge holding electrode; determining whether an electric charge writing function and an electric charge holding function of the second electric charge holding electrode are good or not based on (i) one of a quantity of the electric charges supplied to the second electric charge holding electrode and a quantity corresponding to the electric charges supplied to the second electric charge holding electrode, and (ii) a quantity of the electric charges output from the second electric charge holding electrode; fixing a counter substrate at a position opposing the substrate; and sealing a liquid crystal material between the substrate and the counter substrate.

A method of manufacturing a liquid crystal display according to still another aspect of the present invention includes: forming an electric circuit including a predetermined substrate, an output line, first and second scan lines, a first electric charge holding electrode which is electrically connected to the output line when a predetermined drive voltage is supplied to the first scan line, a second electric charge holding electrode which is electrically connected to the output line when a predetermined drive voltage is supplied to both the first and second scan lines, and a third electric charge holding electrode which is electrically connected to the output line when a predetermined drive voltage is supplied to the second scan line; detecting and storing electric charges of at least one of the first electric charge holding electrode and the third electric charge holding electrode; supplying predetermined electric charges to the second electric charge holding electrode and at least one of the first electric charge holding electrode and the third electric charge holding electrode; changing voltages of the first and second scan lines into a drive voltage after a predetermined period of time from supplying of the predetermined electric charges to drive switching devices and to output the electric charges held in the second electric charge holding electrode and the at least one of the first electric charge holding electrode and the third electric charge holding electrode; determining an electric charge writing function and an electric charge holding function of the second electric charge holding electrode based on (i) the stored electric charges, (ii) the output electric charges, and (iii) one of a quantity of the supplied electric charges and a quantity corresponding to the supplied electric charges; fixing a counter substrate at a position opposing the substrate; and sealing a liquid crystal material between the substrate and the counter substrate.

A circuit inspection apparatus according to still another aspect of the present invention includes: an electric charge supplying unit that supplies electric charges to a first, second, and third electric charge holding electrodes, the first electric charge holding electrode being electrically connected to an output line when a predetermined drive voltage is supplied to a first scan line, the second electric charge holding electrode being electrically connected to the output line when a predetermined drive voltage is supplied to both the first scan line and a second scan line, the third electric charge holding electrode being electrically connected to the output line when a predetermined drive voltage is supplied to the second scan line; a scan line driving unit that changes voltages of the first and second scan lines to a drive voltage; an electric charge detecting unit that derives the electric charges from the first electric charge holding electrode after a predetermined period of time from supplying of the electric charges by the electric charge supplying unit, and detects the electric charges held in the second electric charge holding electrode when the scan line driving unit changes the voltages of the first and second scan lines; and a determining unit that determines whether an electric charge writing function and an electric charge holding function of the second electric charge holding electrode are good or not based on (i) one of a quantity of the supplied electric charges and a quantity corresponding to the supplied electric charges, and (ii) a quantity of the electric charges output from the second electric charge holding electrode.

According to the present invention, the electric charges held in the second electric charge holding electrode can be output independently of electric charges held in another electric charge holding electrode. For this reason, an electric charge writing function and an electric charge holding function related to the second electric charge holding electrode can be correctly determined.

According to the present invention, even though the electric charges held in the second electric charge holding electrode are output simultaneously with charges held in another electric charge holding electrode, a quantity of electric charge of the other electric charge holding electrode is stored in advance. By using the stored quantity of electric charge, an advantage of being able to correctly determine an electric charge writing function and an electric charge holding function related to the second electric charge holding electrode can be achieved.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a circuit inspection method, a circuit inspection apparatus, and a method of manufacturing a liquid crystal display according to the present invention will be described below with reference to the drawings. It must be noticed that the drawings are typical and different from actual diagrams. The drawings partially include different dimensional relationships and different dimensional proportions, as a matter of course. The following description will be made on the assumption that a thin film transistor which forms a switching device to be mentioned later has an n-type conductivity. However, a p-type thin film transistor may be used as a matter of course. When a switching device is formed by using a p-type thin film transistor, the transistor consequently operates like the switching device using an n-type thin film transistor by inverting the polarity of an applied voltage.

Figure 1:
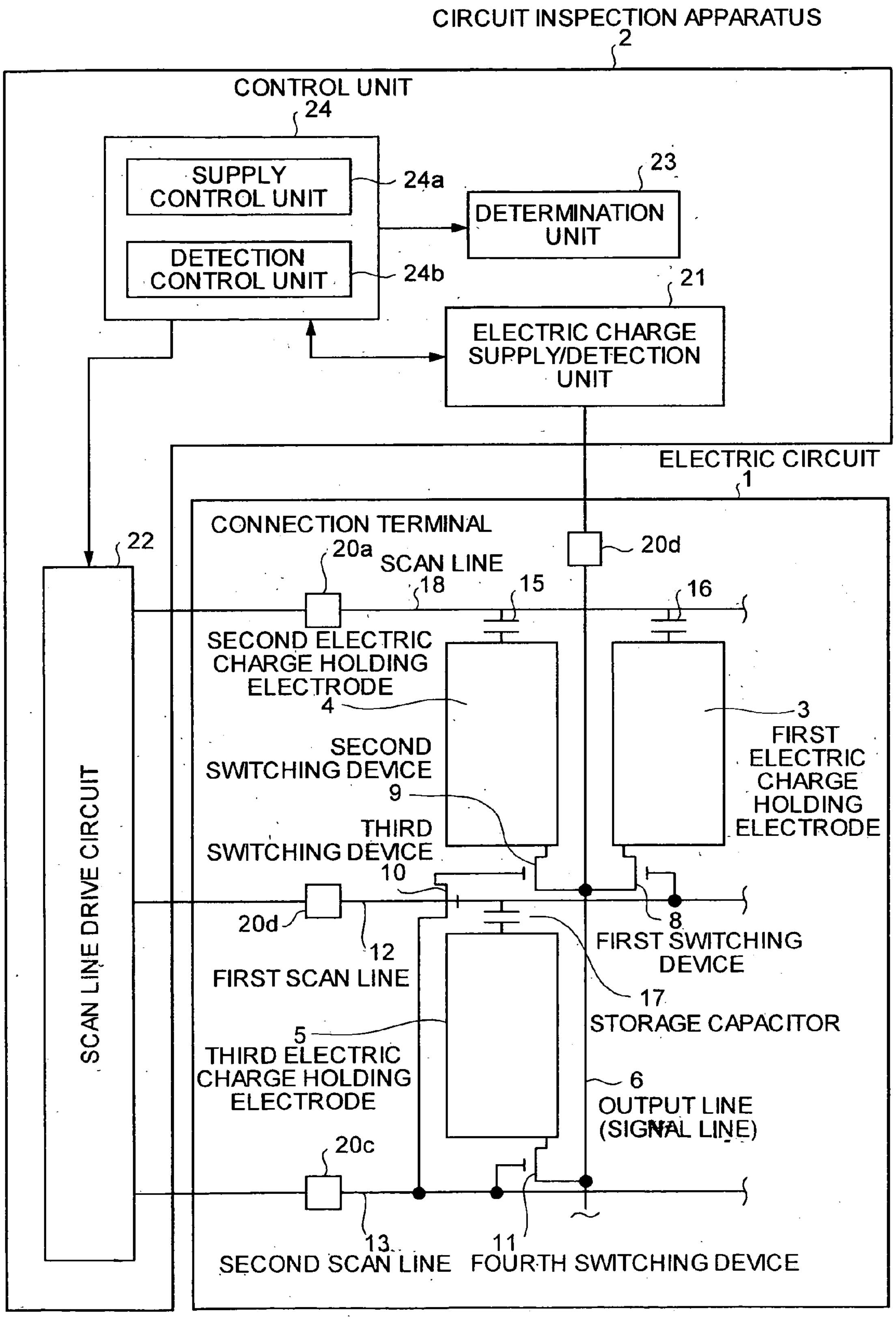
FIG. 1 is a block diagram showing a configuration of a circuit inspection apparatus according to a first embodiment.

A circuit inspection apparatus according to a first embodiment will be described below. FIG. 1 is a typical diagram showing an overall configuration of an electric circuit 1 to be inspected and a circuit inspection apparatus 2 according to the first embodiment. It is assumed that, after the electric circuit 1 to be inspected is explained, the circuit inspection apparatus 2 is explained, and an inspection method using the circuit inspection apparatus 2 is explained.

As shown in FIG. 1, the electric circuit 1 to be inspected includes: first, second, and third electric charge holding electrodes 3, 4, and 5 each having an electric charge writing function and an electric charge holding function; an output line 6; a first switching device 8 which controls an electric connection state between the first electric charge holding electrode 3 and the output line 6; a second switching device 9 which controls an electric connection state between the second electric charge holding electrode 4 and the output line 6; a third switching device 10 which controls a drive state of the second switching device 9; a fourth switching device 11 which controls an electric connection state between the third electric charge holding electrode 5 and the output line; a first scan line 12 which controls drive states of the first switching device 8 and the third switching device 10; and a second scan line 13 which controls a drive state of the fourth switching device 11 and controls a drive state of the second switching device when the third switching device 10 is driven (i.e., in an ON state).

The electric circuit 1 to be inspected includes storage capacitors 15 to 17 having the first electric charge holding electrode 3, the second electric charge holding electrode 4, and the third electric charge holding electrode 5 as one electrodes, respectively. As will be described in the second embodiment, the storage capacitors 15 to 17 are formed by overlapping, e.g., electric charge holding electrodes (pixel electrodes) and scan lines. For this reason, also in the electric circuit 1, in order to achieve storage capacitors 15 and 16, a scan line 18 is arranged independently of the first scan line 12 and the second scan line 13. Furthermore, the electric circuit 1 includes the scan line 18, connection terminals 20*a* to 20*c* to electrically connect the first scan line 12 and the second scan line 13 to an external device, and a connection terminal 20*d* to electrically connect the output line 6 to the external device.

For example, the electric circuit 1 is the same as the circuit formed on an array substrate serving as a constituent element of a liquid crystal display to realize a liquid crystal display having a multiple pixel structure. When the circuit is formed on the array substrate, the first electric charge holding electrode 3, the second electric charge holding electrode 4, and the third electric charge holding electrode 5 formed on the electric circuit 1 function as pixel electrodes, and the output line 6 functions as a data line which supplies electric charges (directly, voltage) depending on a display gradation to pixel electrodes. When the electric circuit 1 is formed on the array substrate constituting the liquid crystal display, the plurality of output lines 6 (data lines) and the plurality of scan lines are arranged in the form of a matrix, and the large number of first electric charge holding electrodes 3 and the large number of second electric charge holding electrodes 4 are arranged depending on display pixels.

The first electric charge holding electrode 3 to the third electric charge holding electrode 5 are to hold supplied electric charges for a predetermined period of time. For example, when the electric circuit 1 is formed on the array substrate constituting, e.g., a liquid crystal display, electric charges depending on a display gradation are held by the first electric charge holding electrode 3 to the third electric charge holding electrode 5 over the predetermined period of time to apply an electric field depending on the display gradation to a liquid crystal layer formed on the array substrate, thereby performing image display. When the electric charge holding electrodes used in the liquid crystal display, the electric charge holding function is realized by not only the storage capacities 15 to 17 but also a sum of capacities formed between the electric charge holding electrodes (pixel electrodes) and a common electrode formed on a counter substrate arranged opposite to the array substrate.

The first switching device 8 to the fourth switching device 11 are formed by thin film transistors, respectively, and have structures which apply drive voltages to gate electrodes to electrically connect two source/drain electrodes to each other. More specifically, the first switching device 8, the second switching device 9, and the fourth switching device 11 have functions which electrically connect corresponding electric charge holding electrodes and output lines to each other by applying drive voltages to the gate electrodes. The third switching device 10 has a function which electrically connects the second scan line 13 to the second switching device 9 by applying a drive voltage.

The first scan line 12 and the second scan line 13 are to control drive states of the first switching device 8 and the like. More specifically, the first scan line 12 has a function which applies a voltage to the gate electrodes of the first switching device 8 and the third switching device 10 on the basis of an externally applied voltage. The second scan line 13 has a function which applies a voltage to the gate electrode of the fourth switching device 11 on the basis of an externally applied voltage and a function which applies a voltage to one source/drain electrode of the third switching device 10. In this case, the other source/drain electrode of the third switching device 10 is connected to the gate electrode of the second switching device 9. Therefore, when the third switching device 10 is driven to electrically connect the two source/drain electrodes to each other, the second scan line 13 and the gate electrode of the second switching device 9 are consequently electrically connected to each other. The second scan line 13 can control the drive state of the second switching device 9 when the third switching device 10 is driven.

The circuit inspection apparatus 2 according to the first embodiment will be described below. The circuit inspection apparatus 2 according to the first embodiment supplies electric charges to an electric charge holding electrode held by the electric circuit 1 to be inspected and detects the electric charges held in the electric charge holding electrodes over a predetermined period of time. The circuit inspection apparatus 2 is to determine whether an electric charge writing function and an electric charge holding function related to each charge holding electrode are good or not on the basis of the supplied electric charges and the detected electric charges.

The circuit inspection apparatus 2, as shown in FIG. 1, includes an electric charge supply/detection unit 21 which is electrically connected to the output line 6 in an inspection to supply and detect electric charges for the output line 6, a scan line drive circuit 22 which controls voltages of at least the first scan line 12 and the second scan line 13, a determination unit 23 which determines whether an electric charge writing function and an electric charge holding function on the basis of the supplied electric charges and the detected electric charges, and a control unit 24 which controls operations of the electric charge supply/detection unit 21, the scan line drive circuit 22, and the determination unit 23.

The electric charge supply/detection unit 21 supplies and detects electric charges for the output line 6 in use. The electric charge supply/detection unit 21 functions as an example of an electric charge supply unit and an electric charge detection unit in the spirit and scope of the invention. As described above, the output line 6 is electrically connected to the first electric charge holding electrode 3 or the like depending on a drive state of the first switching device 8 or the like. Therefore, the electric charge supply/detection unit 21 supplies and detects electric charges for respective electric charge holding electrode in conjunction with the drive state of the first switching device 8 or the like.

Figure 2:
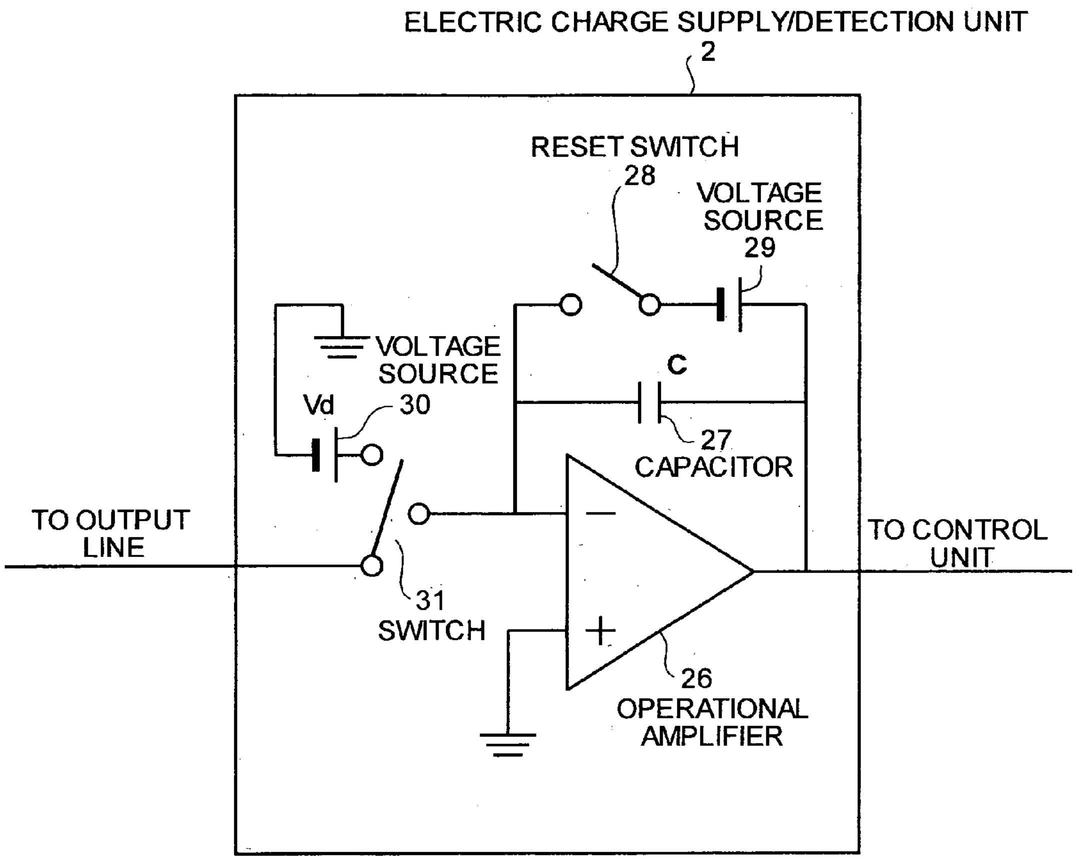
FIG. 2 is a circuit diagram showing a configuration of an electric charge supply/detection unit.

FIG. 2 is a circuit diagram showing a concrete configuration of the electric charge supply/detection unit 21. As shown in FIG. 2, the electric charge supply/detection unit 21 includes: an operational amplifier 26 having a noninverted input side which is grounded; a capacitor 27 arranged between an inverted input side of the operational amplifier 26 and an output side of the operational amplifier 26; a reset switch 28 and a voltage source 29 which are connected in parallel with the capacitor 27 to reset electric charges accumulated in the capacitor 27; a voltage source 30 used when electric charges are supplied to the output line 6; and a switch 31 which switches a connection to the output line 6 between the voltage source 30 and the inverted input side of the operational amplifier 26. The output side of the operational amplifier 26 is electrically connected to the control unit 24. The operational amplifier 26 has a function which outputs a voltage value obtained by an integrator formed by the operational amplifier 26 and the capacitor 27 to the control unit 24 in detection of electric charges.

The scan line drive circuit 22 has a function which controls voltages of the first scan line 12 and the second scan line 13. The scan line drive circuit 22 has a function which controls the drive states of the first switching device 8 to the fourth switching device 11 by controlling the voltages. As a concrete configuration of the scan line drive circuit 22, a circuit similar to a known scan line drive circuit in a liquid crystal display is sufficient. For this reason, details of the scan line drive circuit 22 will be omitted.

The determination unit 23 is to determine whether electric charge wiring functions and electric charge holding functions related to the first electric charge holding electrode 3 to the third electric charge holding electrode 5 are good or not. More specifically, the determination unit 23 compares quantities of electric charge supplied to the electric charge holding electrodes by the electric charge supply/detection unit 21 with a detected quantity of electric charge to determine whether the electric charge writing functions and the electric charge holding functions related to the electric charge holding electrodes. For example, the determination unit 23 determines that the electric charge writing functions and the electric charge holding functions are good when a difference value between the quantity of supplied electric charge and the quantity of detected electric charge is smaller than a threshold value. When the difference value is larger than the threshold value or more, it is determined that the electric charge writing functions and the electric charge holding functions are no good.

The control unit 24 is to control operations of the constituent elements included in the circuit inspection apparatus 2. More specifically, the control unit 24 includes a supply control unit 24*a* which performs not only a general control operation to the constituent elements but also a control operation to operate the electric charge supply/detection unit 21 and the scan line drive circuit 22 in conjunction with each other especially when an electric charge supply operation to the electric circuit 1 is performed, and a detection control unit 24*b* which performs a control operation to operate the electric charge supply/detection unit 21 and the scan line drive circuit 22 in conjunction with each other when an electric charge detection operation.

The details of the control operation performed by the supply control unit 24*a* and the detection control unit 24*b* will be described below. After the operation of the supply control unit 24*a* will be described, the operation of the detection control unit 24*b* will be described. It is assumed that, throughout the electric charge supply operation and the electric charge detection operation, the voltage of the scan line 18 is held at a constant value $V_{gL}$ by the scan line drive circuit 22. It is also assumed that the voltages of the first scan line 12 and the second scan line 13 are held at the constant value $V_{gL}$ when the switching device is not driven.

Figure 3:
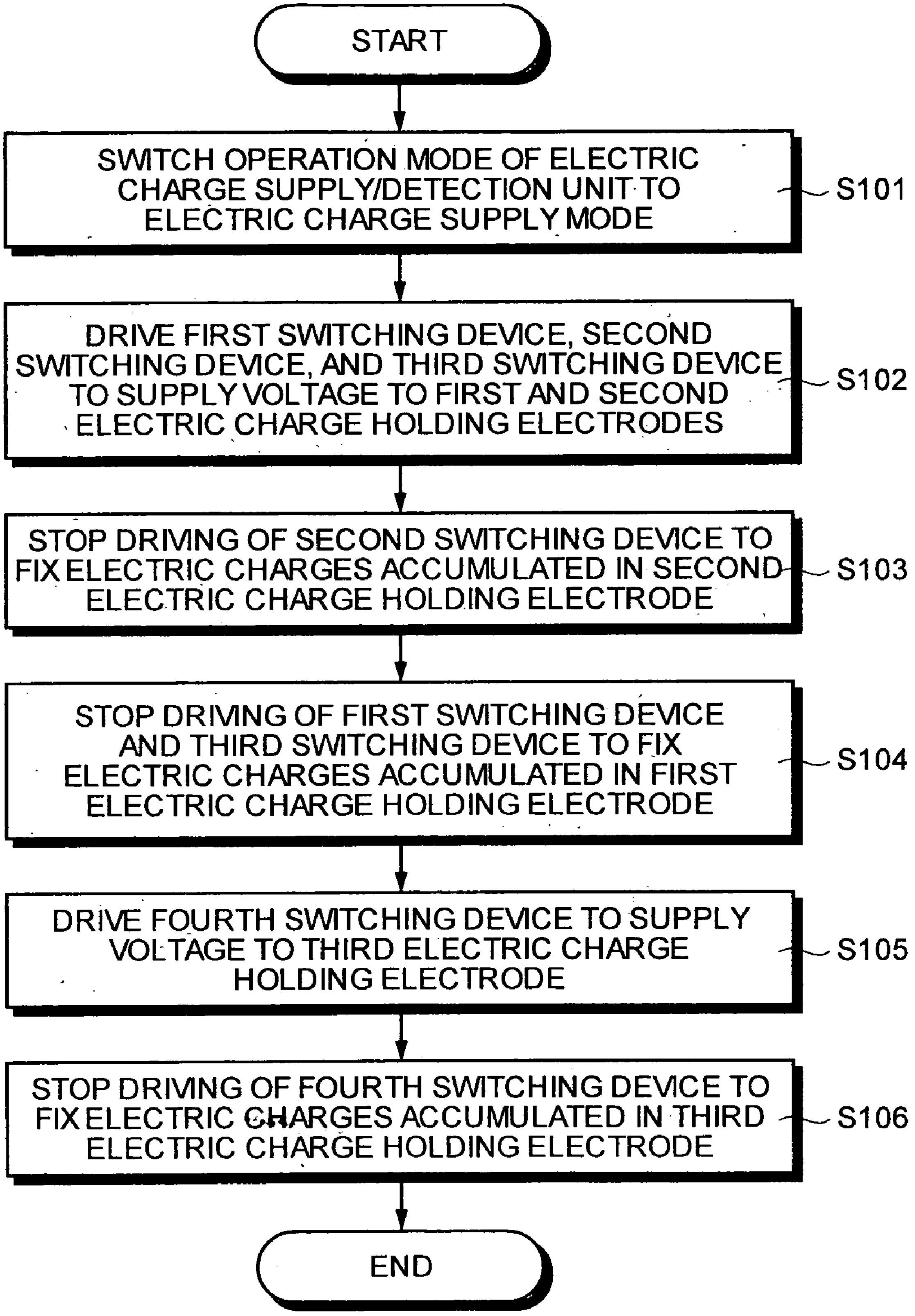
FIG. 3 is a flow chart for explaining an operation of a supply control unit.
Figure 4:
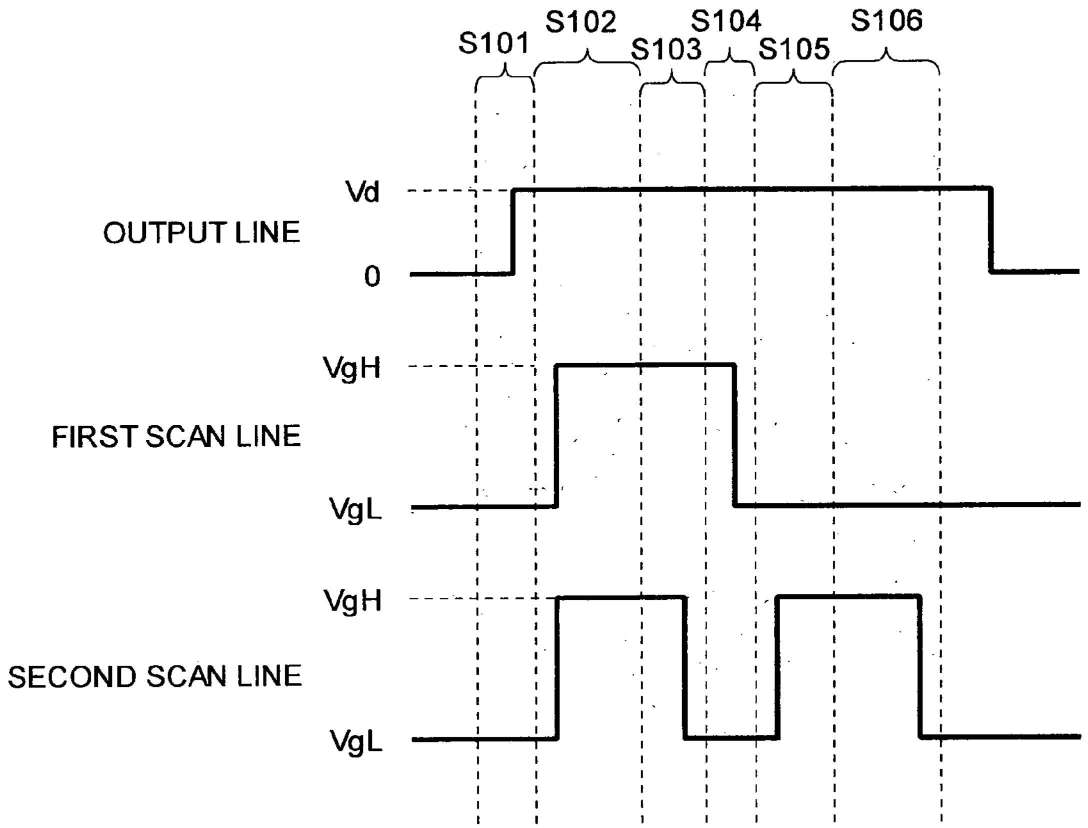
FIG. 4 is a time chart of voltages of an output line, a first scan line, and a second scan line, the voltages of which vary with the operation of the supply control unit.

FIG. 3 is a flow chart for explaining the control operation of the supply control unit 24*a*. FIG. 4 is a time chart showing variations in voltages of the output line 6, the first scan line 12, and the second scan line 13, the voltages of which vary by the control of the supply control unit 24*a*. The control operation of the supply control unit 24*a* will be described below with reference to FIGS. 3 and 4 accordingly.

The supply control unit 24*a* designates the electric charge supply/detection unit 21 to switch an operation mode to an electric charge supply mode (step S101). In response to the designation, the electric charge supply/detection unit 21, as shown in FIG. 4, switches the switch 31 included in the electric charge supply/detection unit 21 to the voltage source 30 side to turn on the reset switch 28. As a result, a voltage $V_d$ of the voltage source 30 is supplied to the output line 6.

The supply control unit 24*a* designates the scan line drive circuit 22 to drive the first switching device 8, the second switching device 9, and the third switching device 10 (step S102). In response to the designation, the scan line drive circuit 22, as shown in FIG. 4, supplies a voltage $V_{gH}$ ($>V_{gL}$) enough to drive a thin film transistor to the first scan line 12 and the second scan line 13. Therefore, the voltage $V_d$ of the output line 6 is supplied to the first electric charge holding electrode 3 through the first switching device 8.

The voltage $V_{gH}$ of the second scan line 13 is supplied to the second electric charge holding electrode 4 through the third switching device 10 in an ON state to drive the second switching device 9, and the voltage $V_d$ of the output line 6 is supplied to the second electric charge holding electrode 4 through the second switching device 9 in an ON state. In this step, when the voltage of the second scan line 13 goes to $V_{gH}$, the fourth switching device 11 is also driven, and the voltage is supplied to the third electric charge holding electrode 5. However, since the supplied voltage varies due to an influence of a surrounding variation in voltage or the like, as will be described later, electric charge supply to the third electric charge holding electrode 5 will be described again in the following steps.

The supply control unit 24*a* designates the scan line drive circuit 22 to stop driving of the second switching device 9 (step S103). In response to this designation, the scan line drive circuit 22, as shown in FIG. 4, changes the voltage of the second scan line 13 to $V_{gL}$ while keeping supply of the voltage $V_{gH}$ to the first scan line 12. When the voltage of the first scan line 12 is held, the third switching device 10 is kept in an ON state. For this reason, the voltage $V_{gL}$ of the second scan line 13 is supplied to the gate electrode of the second switching device 9 to stop driving of the second switching device 9, and the second electric charge holding electrode 4 is electrically insulated from the surrounding wiring structures. Immediately before the second switching device 9 is turned off, the voltage of the scan line 18 is $V_{gL}$, and the voltage applied to the second electric charge holding electrode 4 is $V_d$. When it is assumed that the capacitance of the storage capacitor 15 is represented by Cs, a quantity of electric charge $Q_2$ accumulated in the second electric charge holding electrode 4 serving as one electrode in the storage capacitor 15 is given by the following equation:

$$Q_2 = Cs(V_d - V_{gL}) \tag{1}$$

Thereafter, the supply control unit 24*a* designates the scan line drive circuit 22 to stop driving of the first switching device 8 and the third switching device 10 (step S104). In response to this designation, the scan line drive circuit 22, as shown in FIG. 4, changes the voltage of the first scan line 12 from $V_{gH}$ to $V_{gL}$. Since the gate electrode of the first switching device 8 and the gate electrode of the third switching device 10 are electrically connected to the first scan line 12, when the voltage of the first scan line 12 is changed into $V_{gL}$, driving of the first switching device 8 and the third switching device 10 is stopped, and the first electric charge holding electrode 3 is newly electrically insulated from the surrounding wiring structures. Immediately before the electrical insulation, the voltage of the first electric charge holding electrode 3 is $V_d$, and the voltage of the scan line 18 is $V_{gL}$. For this reason, when the capacitance of the storage capacitor 16 is represented by Cs, like the quantity of electric charge $Q_2$, a quantity of electric charge $Q_1$ accumulated in the first electric charge holding electrode 3 is given by the following equation:

$$Q_1=Cs(V_d-V_{gL}) \quad (2)$$

The supply control unit 24*a* designates the scan line drive circuit 22 to drive the fourth switching device 11 (step S105). In response to this designation, the scan line drive circuit 22, as shown in FIG. 4, changes the voltage of the second scan line 13 from $V_{gL}$ to $V_{gH}$ while keeping the voltage of the first scan line 12 at $V_{gL}$. In this manner, the fourth switching device 11 is driven, the third electric charge holding electrode 5 and the output line 6 are electrically connected to each other, and the voltage $V_d$ is supplied to the third electric charge holding electrode 5. In this step, since the voltage of the first scan line 12 is kept at $V_{gL}$ to stop driving of the third switching device 10, the voltage of the second scan line 13 does not adversely affect the driving of the second switching device 9.

Finally, the supply control unit 24*a* designates the scan line drive circuit 22 to stop driving of the fourth switching device 11 (step S106). In response to this designation, the scan line drive circuit 22, as shown in FIG. 4, changes the voltage of the second scan line 13 from $V_{gH}$ to $V_{gL}$ to stop driving of the fourth switching device 11. As a result, the third electric charge holding electrode 5 is electrically insulated from the output line 6. At this time, the voltage of the first scan line 12 is $V_{gL}$, and the voltage of the third electric charge holding electrode 5 is $V_d$. When it is assumed that the capacitance of the storage capacitor 17 is represented by Cs, like the quantities of electric charge $Q_1$ and $Q_2$, a quantity of electric charge $Q_3$ accumulated in the third electric charge holding electrode 5 is given by the following equation:

$$Q_3=C_s(V_d-V_{gL}) \quad (3)$$

With the above operations, supply of electric charges to the first electric charge holding electrode 3 to the third electric charge holding electrode 5 is completed. As shown in Equations (1) to (3), the electric charge quantity of which is given by $Cs(V_d-V_{gL})$ is accumulated to each of all the electric charge holding electrodes.

Figure 5:
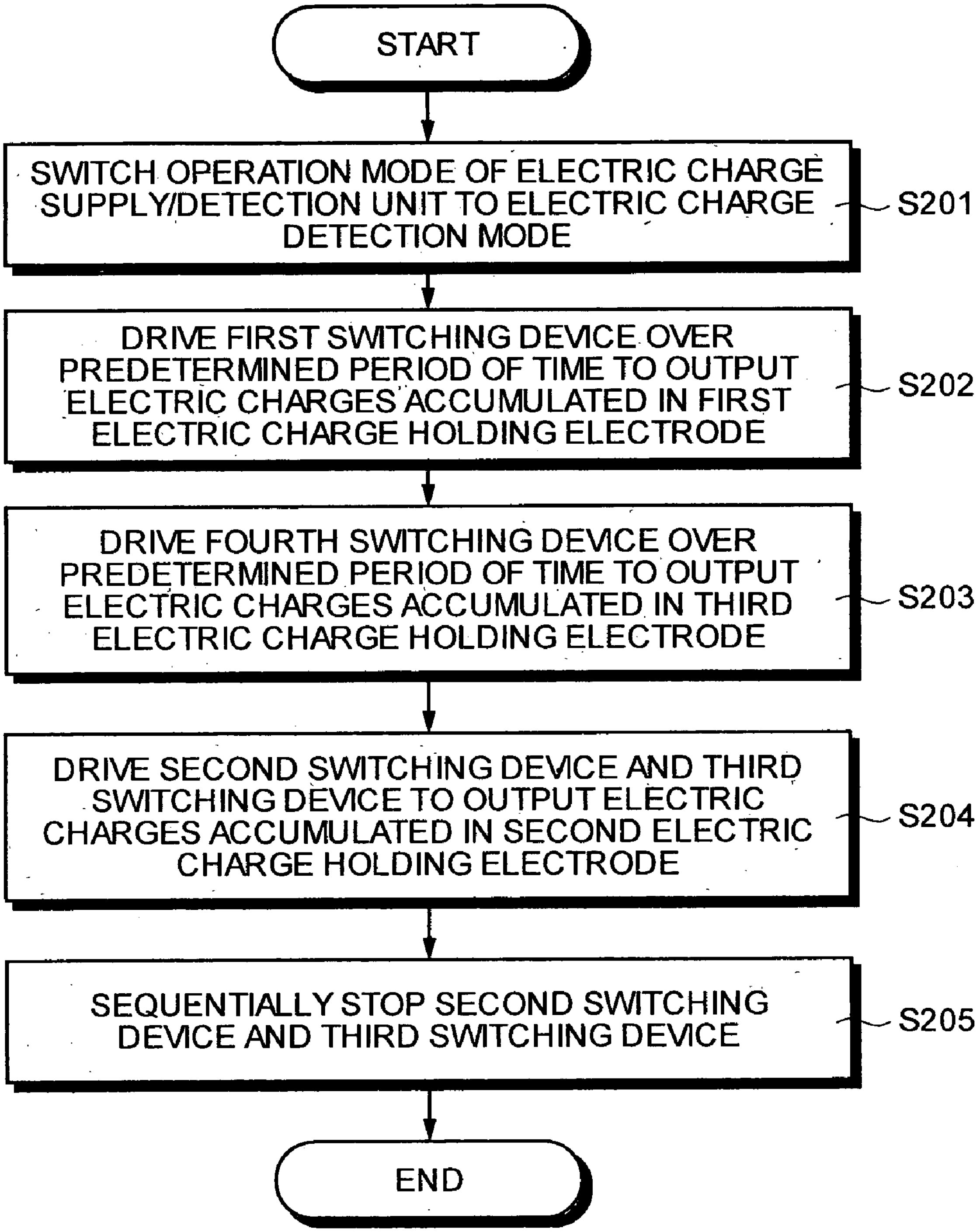
FIG. 5 is a flow chart for explaining a detection control unit.
Figure 6:
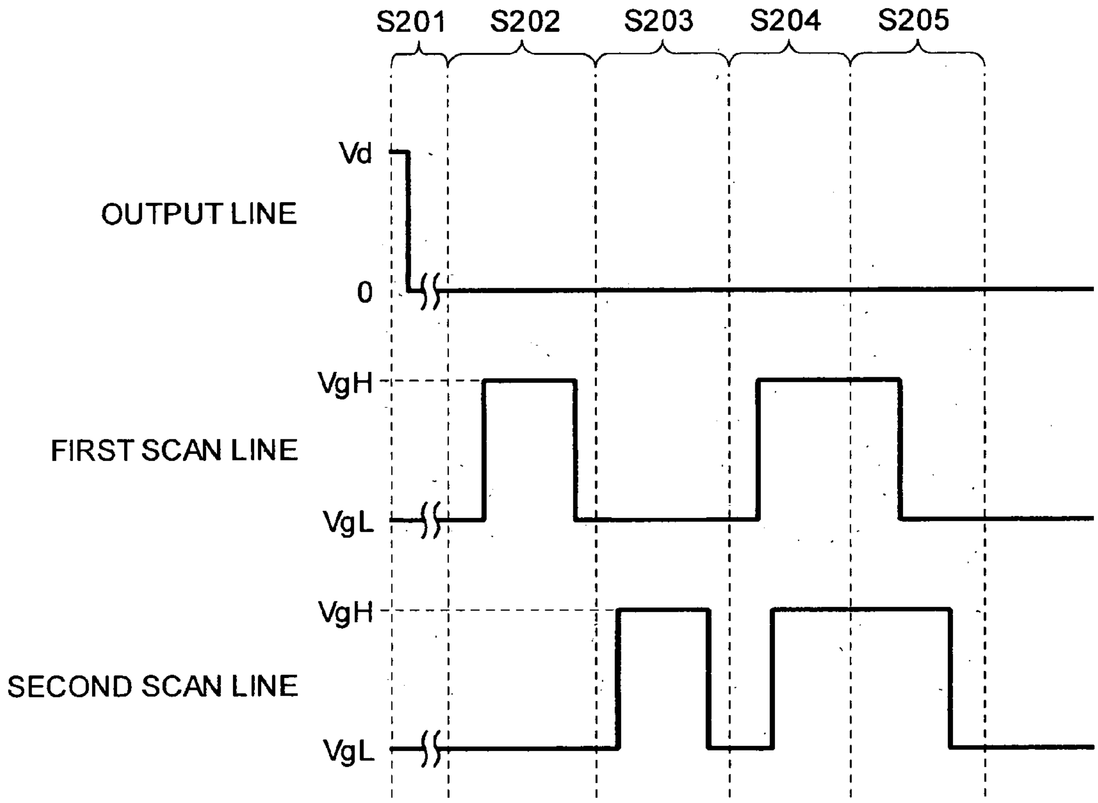
FIG. 6 is a time chart of voltages of an output line, a first scan line, and a second scan line, the voltages of which vary with the operation of the detection control unit.

A detection control operation performed by the detection control unit 24*b* will be described below. FIG. 5 is a flow chart for explaining a detection control operation performed by the detection control unit 24*b*, and FIG. 6 is a time chart showing variations in voltage supplied from the electric charge supply/detection unit 21 and the scan line drive circuit 22 to the electric circuit 1 with the control of the detection control unit 24*b*.

The detection control unit 24*b* designates the electric charge supply/detection unit 21 to switch an operation mode to an electric charge detection mode (step S201). In response to this designation, the electric charge supply/detection unit 21 switches the switch 31 to switch the output line 6 from a state of being connected to the voltage source 30 to a state of being connected to the inverted input side of the operational amplifier 26. In this manner, the voltage supplied from the electric charge supply/detection unit 21 to the output line 6, as shown in FIG. 6, becomes zero voltage. The electric charge supply/detection unit 21 changes the state of the reset switch 28 which is in an ON state in the electric charge supply operation into an OFF state.

A predetermined period of time after, the detection control unit 24*b* designates the scan line drive circuit 22 to drive the first switching device 8 over a predetermined period of time (step S202). In response to this designation, the scan line drive circuit 22, as shown in FIG. 6, changes the voltage of the first scan line 12 from $V_{gL}$ to $V_{gH}$ over a predetermined period of time while keeping the voltage of the second scan line 13 at $V_{gL}$. Therefore, the first switching device 8 having a gate electrode electrically connected to the first scan line 12 begins to be driven, and the first electric charge holding electrode 3 and the output line 6 are electrically connected to each other.

Since the voltage of the output line 6 is kept at zero, the voltage of the first electric charge holding electrode 3 also changes into zero voltage. On the other hand, since the voltage of the scan line 18 is kept at $V_{gL}$, a quantity of electric charge $Q_1'$ held in the first electric charge holding electrode 3 is given by the following equation:

$$Q_1'=Cs(0-V_{gL}) \quad (2)'$$

For this reason, electric charges corresponding to a difference between a quantity of electric charge held in the first electric charge holding electrode 3 immediately before the first electric charge holding electrode 3 is electrically connected to the output line 6 and the quantity of electric charge $Q_1'$ is output to the electric charge supply/detection unit 21 through the output line 6. The electric charge supply/detection unit 21 derives a voltage signal corresponding to the output electric charges and performs a digital transformation process to the voltage signal. The electric charge supply/detection unit 21 outputs the voltage data to the control unit 24. In this step, when the voltage of the first scan line 12 changes into $V_{gH}$, the third switching device 10 is also set in a drive state. Since the voltage of the second scan line 13 is kept at $V_{gL}$, the second switching device 9 is not driven, and the second electric charge holding electrode 4 and the output line 6 are kept in an electrical insulating state.

Thereafter, the detection control unit 24*b* designates the reset switch 28 to be turned on or off, and resets electric charges accumulated in the capacitor 27. The detection control unit 24*b* designates the scan line drive circuit 22 to drive the fourth switching device 11 over a predetermined period of time (step S203). In response to this designation, the scan line drive circuit 22, as shown in FIG. 6, changes the voltage of the second scan line 13 from $V_{gL}$ to $V_{gH}$ over a predetermined period of time while keeping the voltage of the first scan line 12 at $V_{gL}$. Therefore, the fourth switching device 11 is driven over a predetermined period of time, and the third electric charge holding electrode 5 and the output line 6 are electrically connected to each other.

Since the output line 6 supplies a voltage of 0, the voltage of the third electric charge holding electrode 5 also changes into zero, and the voltage of the first scan line 12 is kept at $V_{gL}$. Therefore, a quantity of electric charge $Q_3'$ held in the third electric charge holding electrode 5 after the third electric charge holding electrode 5 is electrically connected to the output line 6 is given by the following equation:

$$Q_3'=Cs(0-V_{gL}) \quad (3)'$$

For this reason, while the third electric charge holding electrode 5 is electrically connected to the output line 6, electric charges corresponding to a difference value between a quantity of electric charge held in the third electric charge holding electrode 5 immediately before the electrical connection and the quantity of electric charge $Q_3'$ are output to the electric charge supply/detection unit 21 through the output line 6. Digital data of the voltage corresponding to the electric charges is output to the control unit 24.

Thereafter, the detection control unit 24*b* designates the reset switch 28 to be turned on or off, and resets electric charges accumulated in the capacitor 27. The detection control unit 24*b* designates the scan line drive circuit 22 to drive the second switching device 9 and the third switching device 10 (step S204). In response to this designation, the scan line drive circuit 22, as shown in FIG. 6, changes the voltages of the first scan line 12 and the second scan line 13 from $V_{gL}$ to $V_{gH}$ to drive the second switching device 9 and the third switching device 10. As s result, the second electric charge holding electrode 4 is electrically connected to the output line 6, and the voltage of the second electric charge holding electrode 4 is equal to the voltage of 0 of the output line 6. Since the voltage of the scan line 18 is kept at $V_{gL}$, a quantity of electric charge $Q_2'$ held in the second electric charge holding electrode 4 after the second electric charge holding electrode 4 is electrically connected to the output line 6 is given by the following equation:

$$Q_2'=Cs(0-V_{gL}) \quad (1)'$$

For this reason, while the second electric charge holding electrode 4 is electrically connected to the output line 6, electric charges corresponding to a difference value between a quantity of electric charge held in the second electric charge holding electrode 4 immediately before the electrical connection and the quantity of electric charge $Q_2'$ are output to the electric charge supply/detection unit 21 through the output line 6.

Thereafter, the electric charge supply/detection unit 21 designates the scan line drive circuit 22 to sequentially stop the second switching device 9 and the third switching device 10 (step S205). In response to this designation, the scan line drive circuit 22, as shown in FIG. 6, changes the voltage of the first scan line 12 from $V_{gH}$ to $V_{gL}$ and then changes the voltage of the second scan line 13 from $V_{gH}$ to $V_{gL}$. This order of the variations in voltage is set to exclude the influence of the variation in voltage of the third electric charge holding electrode 5 due to capacitive coupling.

With the above steps, quantities of electric charge held in the first electric charge holding electrode 3 to the third electric charge holding electrode 5 at a predetermined period of time after the supply of electric charges are independently output to the electric charge supply/detection unit 21. The output quantities of electric charge are converted into corresponding voltages by the electric charge supply/detection unit 21, and the resultant voltages are output to the control unit 24. The control unit 24 outputs voltages corresponding to quantities of supplied electric charge and quantities of detected electric charge to the determination unit 23 in units of electric charge holding electrodes. The determination unit 23 compares both the quantities for each electric charge holding electrode. When a ratio of the quantity of supplied electric charge to the quantity of detected electric charge is a predetermined threshold value or less, the determination unit 23 determines that an electric charge writing function and an electric charge holding function related to the electric charge holding electrode are no good, and outputs the determination result to the control unit 24.

An advantage of the circuit inspection apparatus according to the first embodiment will be described below. In the circuit inspection apparatus according to the first embodiment, in determination of an electric charge writing function and an electric charge holding function related to an electric charge holding electrode (pixel electrode) in the electric circuit 1 formed on an array substrate of a liquid crystal display having a multiple pixel structure, scan lines are scanned in an order different from the order in the supply of electric charges to make it possible to independently detect electric charges accumulated in the first electric charge holding electrode 3 to the third electric charge holding electrode 5. Therefore, even though a circuit structure such as the electric circuit 1 formed on an array substrate of a liquid crystal display having a multiple pixel structure is used, electric charge writing functions and electric charge holding functions of the respective electric charge holding electrodes can be directly detected. Therefore, for example, when the characteristics of the array substrate of the liquid crystal display having the multiple pixel structure are inspected, defective portions can be accurately specified. A disadvantage of erroneously wasting an actually good product as a defective product can be prevented.

A first modification of the circuit inspection apparatus according to the first embodiment will be described below. In the first modification, the circuit inspection apparatus has a configuration in which electric charges corresponding to a voltage of 0 are supplied to the third electric charge holding electrode 5 in advance to omit an output operation of electric charges accumulated in the third electric charge holding electrode 5 in detection of electric charges. The following discussion is made on the assumption that an electric charge writing function and an electric charge holding function related to the third electric charge holding electrode 5 have no problem. The first modification is preferably applied to a case in which an electric charge writing function and an electric charge holding function related to any one of the first electric charge holding electrode 3 and the second electric charge holding electrode 4 are suspected to be no good or a case in which the third electric charge holding electrode 5 is additionally inspected.

Figure 7:
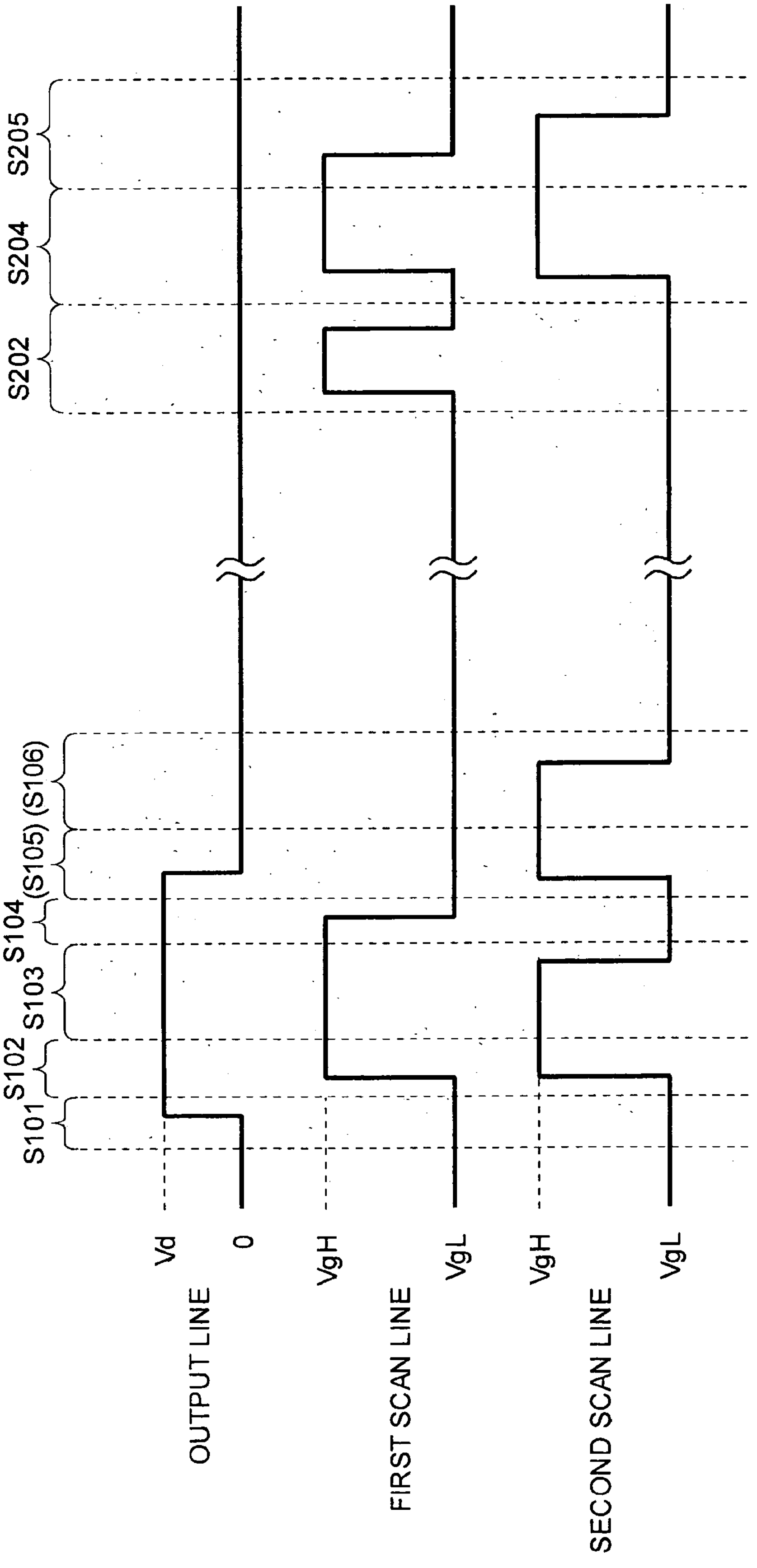
FIG. 7 is a time chart showing variations in voltage of the output line, the first scan line, and the second scan line in the first modification.

FIG. 7 is a time chart showing variations in voltage of the output line 6, the first scan line 12, and the second scan line 13 in supply and detection of electric charges in the first modification. In FIG. 7, in comparison with the first embodiment, step numbers are added to parts corresponding to steps S101 to S106 and steps S201 to S205 in the first embodiment, respectively.

As shown in FIG. 7, in the first modification, in periods corresponding to steps S105 and S106 in the first embodiment, zero voltage is supplied to the output line 6 by the electric charge supply/detection unit 21. As described in steps S105 and S106, since the fourth switching device 11 is driven in the periods, zero voltage is supplied to the third electric charge holding electrode 5 through the output line 6, and electric charges corresponding to the zero voltage are accumulated.

On the other hand, in the first modification, as shown in FIG. 7, in a period corresponding to a detection control operation, a step corresponding to step S203 in the first embodiment is omitted. Step S203 in the first embodiment is a step to output electric charges accumulated in the third electric charge holding electrode 5 to the electric charge supply/detection unit 21 through the output line 6. It is not proper to omit this process in the first embodiment. More specifically, when step S203 is omitted in the first embodiment, electric charges held in the second electric charge holding electrode 4 and electric charges held in the third electric charge holding electrode 5 in step S204 are simultaneously output to the electric charge supply/detection unit 21 through the output line 6. For this reason, an electric charge writing function and an electric charge holding function related to the second electric charge holding electrode 4 cannot be correctly detected.

However, in the first modification, since zero voltage is supplied in steps S105 and S106, electric charges held in the third electric charge holding electrode 5 correspond to zero voltage. Even though the third electric charge holding electrode 5 and the output line 6 are electrically connected to each other when the output line 6 becomes zero voltage, the voltages of the output line 6 and the third electric charge holding electrode 5 are not different from each other, and electric charges are not output from the third electric charge holding electrode 5. For this reason, in the first modification, even though step S203 is omitted, electric charges output in step S204 are only electric charges held in the second electric charge holding electrode 4, and an electric charge writing function and an electric charge holding function related to the second electric charge holding electrode 4 can be correctly detected. Therefore, in the first modification, a step corresponding to step S203 is omitted. The omission of the step makes it possible to shorten an inspection time and to realize a rapid circuit inspection.

A second modification of the circuit inspection apparatus according to the first embodiment will be described below. In the second modification, it is assumed that operations corresponding to steps S105 and S106 in the first embodiment are not performed to shorten time required for an inspection by time required for the operations. In the second modification, it is supposed that an electric charge writing function and an electric charge holding function related to the first electric charge holding electrode 3 and/or the second electric charge holding electrode 4 are targeted for inspection.

Figure 8:
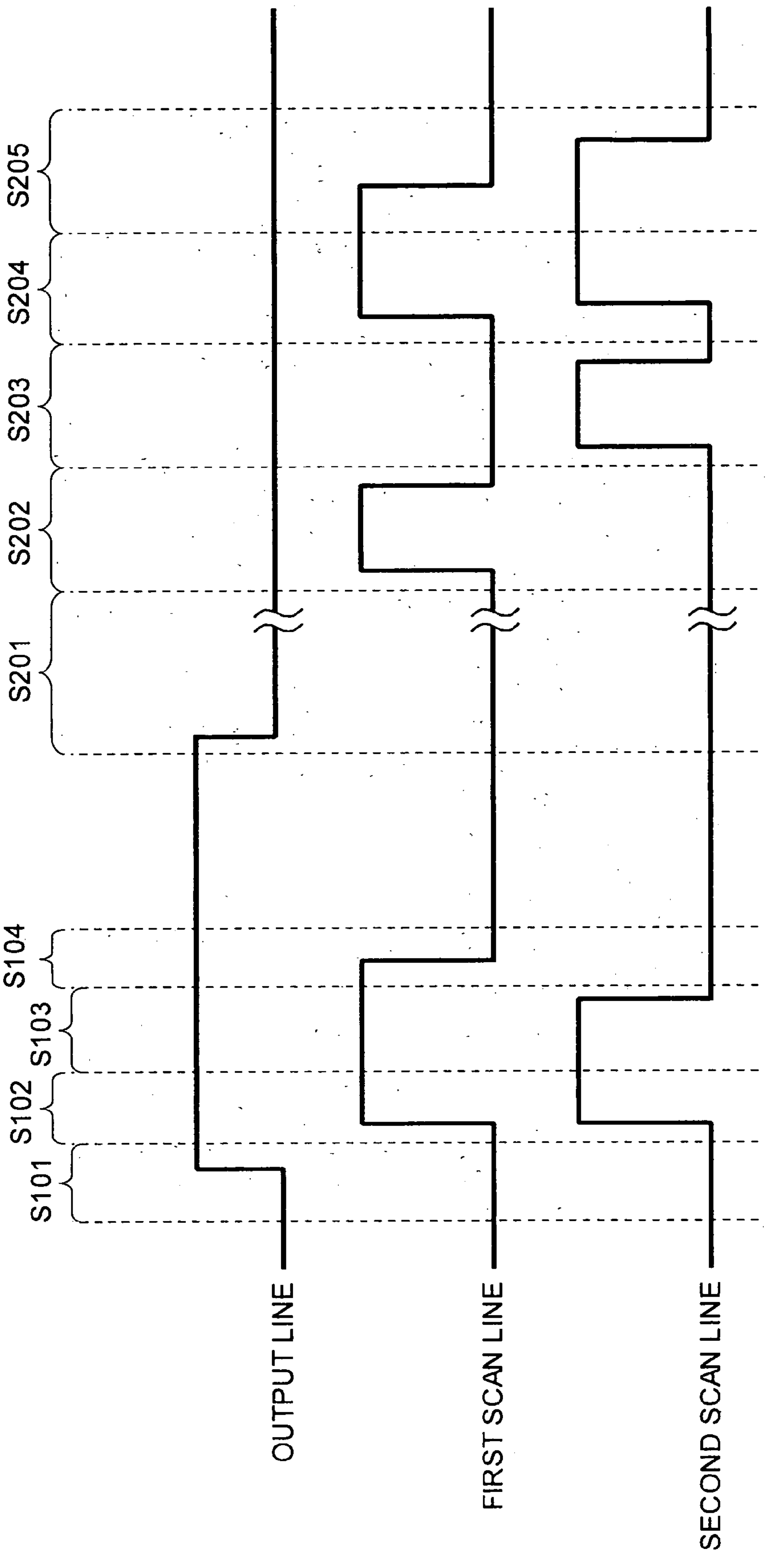
FIG. 8 is a time chart showing variations in voltage of the output line, the first scan line, and the second scan line in the second modification.

FIG. 8 is a time chart showing variations in voltage of the output line 6, the first scan line 12, and the second scan line 13 in supply and detection of electric charges according to the second modification. As shown in FIG. 8, in the second modification, after step S104 in the first embodiment, a variation in voltage of the second scan line 13 corresponding to steps S105 and S106 is not performed. Consequently, specific electric charges are not supplied to the third electric charge holding electrode 5. More specifically, when steps S102 and S103 are performed, the voltage of the second scan line 13 changes into $V_{gH}$. For this reason, the fourth switching device 11 is driven, a voltage is supplied to the third electric charge holding electrode 5, and electric charges are held in the third electric charge holding electrode 5 to some extent. However, in only steps S102 and S103, a quantity of electric charge held in the third electric charge holding electrode 5 cannot be specified. Accumulated electric charges vary due to a variation in voltage or the like of a surrounding wiring structure in steps subsequent to steps S102 and S103.

However, the electric charge writing function and the electric charge holding function related to the third electric charge holding electrode 5 are not targeted for inspection, there is no necessity for specifying a quantity of electric charge supplied to the third electric charge holding electrode 5. More specifically, when the electric charge writing function and the electric charge holding function related to the first electric charge holding electrode 3 and/or the second electric charge holding electrode 4 are inspected, it is sufficient that the third electric charge holding electrode 5 do not adversely affect measurement for other electric charge holding electrodes. For this reason, in the second modification, a step of specifying a quantity of electric charge supplied to the third electric charge holding electrode 5 is omitted.

On the other hand, as in the second modification, even though the electric charge writing function and the electric charge holding function related to the third electric charge holding electrode 5 are not inspected, electric charges accumulated in the third electric charge holding electrode 5 must avoid from adversely affecting detection of electric charges accumulated in the first electric charge holding electrode 3 and the second electric charge holding electrode 4. Therefore, in the second modification, unlike in the first modification, a step corresponding to step S203 in the first embodiment is performed, and the electric charges held in the third electric charge holding electrode 5 are prevented from adversely affecting measurement for other electric charge holding electrodes.

More specifically, by performing the step corresponding to step S203, the fourth switching device 11 is driven while keeping the OFF states of the first switching device 8, the second switching device 9, and the third switching device 10. Therefore, only the third electric charge holding electrode 5 is electrically connected to the output line 6 in a period corresponding to step S203, and only electric charges held in the third electric charge holding electrode 5 are output to the electric charge supply/detection unit 21. For this reason, when the fourth switching device 11 is driven again to electrically connect the third electric charge holding electrode 5 and the output line 6 in step S204 subsequently performed, electric charges to be output are not present any more on the third electric charge holding electrode 5 to prevent detection of a quantity of electric charge held in the second electric charge holding electrode 4 from being adversely affected. As described above, as shown in the second modification, the electric charge writing functions and the electric charge holding functions related to the first electric charge holding electrode 3 and the second electric charge holding electrode 4 can be inspected without performing the operations corresponding to step S105 and S106. With the configuration in which steps S105 and S106 are omitted, the electric charge writing functions and the electric charge holding functions related to the electric charge holding electrodes can be rapidly inspected.

A circuit inspection apparatus according to a second embodiment will be described below. The circuit inspection apparatus according to the second embodiment is to inspect an electric charge writing function and an electric charge holding function related to an electric charge holding electrode included in the electric circuit 1 corresponding to a multiple pixel structure as in the first embodiment. Basically, the circuit inspection apparatus has the same configuration as that of the circuit inspection apparatus 2 according to the first embodiment.

Figure 9:
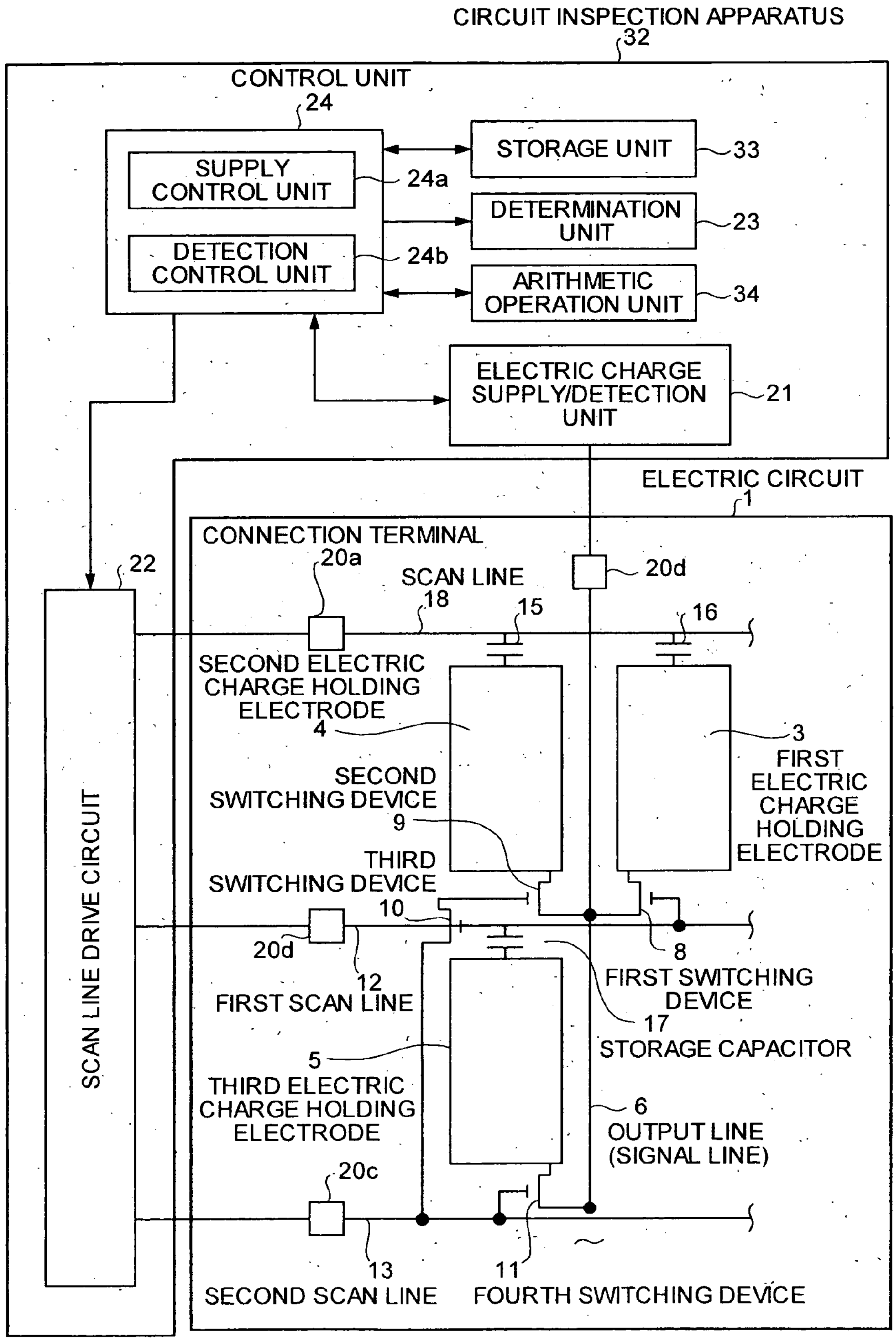
FIG. 9 is a block diagram showing a configuration of a circuit inspection apparatus according to a second embodiment.

FIG. 9 is a block diagram showing the configuration of the circuit inspection apparatus according to the second embodiment. A circuit inspection apparatus 32 according to the second embodiment has a configuration including an electric charge supply/detection unit 21, a scan line drive circuit 22, a determination unit 23, and a control unit 24 as in the first embodiment. The configuration further includes a storage unit 33 and an arithmetic operation unit 34. The storage unit 33 is to store a quantity of electric charge or the like detected on an electric charge holding electrode in the past. The arithmetic operation unit is to perform an arithmetic operation using the quantity of electric charge or the like stored in the storage unit 33.

Figure 10:
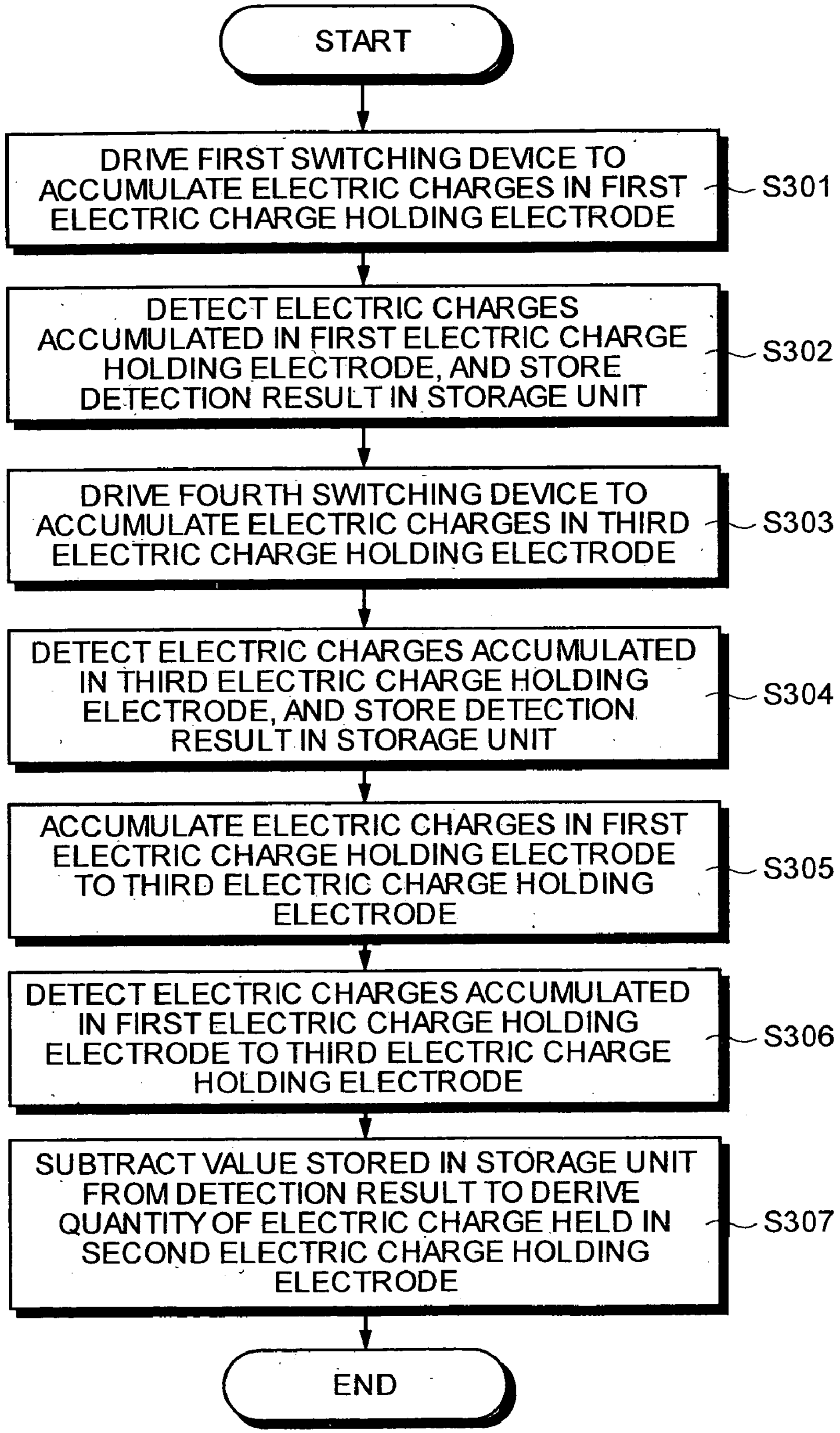
FIG. 10 is a flow chart for explaining an operation of a control unit according to the second embodiment.

An operation of the control unit 24 in inspection of the electric circuit 1 performed by the circuit inspection apparatus according to the second embodiment will be described below. FIG. 10 is a flow chart for explaining an operation of the control unit 24 in inspection of the electric circuit 1 in the second embodiment. An inspection method will be described below with reference to FIG. 10.

The control unit 24 causes the supply control unit 24*a* to drive the first switching device 8 to accumulate electric charges in the first electric charge holding electrode 3 (step S301). More specifically, the supply control unit 24*a* changes an operation mode to an electric charge supply mode for the electric charge supply/detection unit 21 and designates the scan line drive circuit 22 to drive the first switching device 8. In response to this designation, the scan line drive circuit 22 changes the voltage of the first scan line 12 from $V_{gL}$ to $V_{gH}$ over a predetermined period of time to drive the first switching device 8. On the other hand, since the mode of the electric charge supply/detection unit 21 changes into the electric charge supply mode, the voltage of the output line 6 becomes $V_d$, and electric charges corresponding to the voltage $V_d$ are accumulated in the first electric charge holding electrode 3.

The control unit 24 causes the detection control unit 24*b* to detect electric charges held in the first electric charge holding electrode 3 to store a detection result in the storage unit 33 (step S302). More specifically, a predetermined period of time after the end of step S301, the detection control unit 24*b* designates the electric charge supply/detection unit 21 to operate in a detection mode, and designates the scan line drive circuit 22 to drive the first switching device 8. With this operation, electric charges accumulated in the first charge holding electrode are output to the electric charge supply/detection unit 21 through the first switching device 8 and the output line 6. The electric charge supply/detection unit 21 outputs a detection result to the storage unit 33 through the control unit 24. The detection result is stored by the storage unit 33.

The processes are also performed to the third electric charge holding electrode 5. More specifically, the control unit 24 causes the supply control unit 24*a* to drive the fourth switching device 11 and supplies electric charges to the third electric charge holding electrode 5 (step S303). A predetermined period of time after, the control unit 24 causes the detection control unit 24*b* to detect electric charges accumulated in the third electric charge holding electrode 5 and to store a detection result in the storage unit 33 (step S304). With the processes, electric charge writing functions and electric charge holding functions related to the first electric charge holding electrode 3 and the third electric charge holding electrode 5 are detected in advance, and quantities held electric charges are stored in the storage unit 33.

Thereafter, the control unit 24 accumulates electric charges in all the first electric charge holding electrode 3, the second electric charge holding electrode 4, and the third electric charge holding electrode 5 by a designation of the supply control unit 24*a* (step S305). More specifically, the supply control unit 24*a* designates the electric charge supply/detection unit 21 to operate in an electric charge supply mode and designates the scan line drive circuit 22 to drive all the first switching device 8 to the fourth switching device 11. In response to the designation, the scan line drive circuit 22 changes the voltages of the first scan line 12 and the second scan line 13 from $V_{gL}$ to $V_{gH}$ over a predetermined period of time to drive all the first switching device 8 to the fourth switching device 11. The electric charge supply/detection unit 21 shifts to the electric charge supply mode to change the voltage of the output line 6 into $V_d$. For this reason, electric charges corresponding to the voltage $V_d$ are accumulated in the first electric charge holding electrode 3 to the third electric charge holding electrode 5.

The control unit 24 detects the electric charges accumulated in the first electric charge holding electrode 3, the second electric charge holding electrode 4, and the third electric charge holding electrode 5 by a designation of the detection control unit 24*b* (step S306). More specifically, a predetermined period of time after step S305 is performed, the detection control unit 24*b* designates the electric charge supply/detection unit 21 to operate in an electric charge detection mode and designates the scan line drive circuit 22 to drive all the first switching device 8 to the fourth switching device 11. In response to the designation, the scan line drive circuit 22 changes the voltages of the first scan line 12 and the second scan line 13 from $V_{gL}$ to $V_{gH}$ over a predetermined period of time as in step S305 to simultaneously output the electric charges accumulated in the first electric charge holding electrode 3, the second electric charge holding electrode 4, and the third electric charge holding electrode 5 to the electric charge supply/detection unit 21.

Finally, the control unit 24 causes the detection control unit 24*b* to designate the arithmetic operation unit 34 to derive a quantity of electric charge held in the second electric charge holding electrode on the basis of the detection result and the value stored in the storage unit 33 (step S307). As described above, in step S302, the quantity of electric charge held in the first electric charge holding electrode 3 is stored in the storage unit 33. In step S304, the quantity of electric charge held in the third electric charge holding electrode 5 is stored in the storage unit 33. Therefore, the quantity of electric charge to be held in the first electric charge holding electrode 3 to the third electric charge holding electrode 5 is subtracted from a total sum of quantities of electric charge held in the first electric charge holding electrode 3 to the third electric charge holding electrode 5, which is obtained in Step S306, to derive a quantity of electric charge held in the second electric charge holding electrode 4.

With the above step, the quantities of electric charge held in the first electric charge holding electrode 3, the second electric charge holding electrode 4, and the third electric charge holding electrode 5 over a predetermined period of time are derived. Therefore, with respect to each electric charge holding electrode, a quantity of electric charge to be accumulated or a quantity pretended as the quantity (for example, substitutional characteristics such as an average quantity of output electric charge of other electrodes) is compared with a quantity of held electric charge to make it possible to detect an electric charge writing function and an electric charge holding function.

In this manner, even though a configuration in which quantities of electric charge held in a plurality of electric charge holding electrodes are detected as shown in step S306 without directly detecting a quantity of electric charge held in each electric charge holding electrode is employed, an electric charge writing function and an electric charge holding function related to each electric charge holding electrode can be derived. More specifically, when the electric charge writing functions and the electric charge holding functions related to the first electric charge holding electrode 3 and the third electric charge holding electrode 5 are recognized in advance, the electric charge writing function and the electric charge holding function related to the second electric charge holding electrode 4 can be derived.

In the second embodiment, it is assumed that an electric charge supply/detection operation is performed to all the first electric charge holding electrode 3 to the third electric charge holding electrode 5 in steps S305 and S306. However, if at least the second electric charge holding electrode 4 is included, the electric charge supply/detection operation to any one of the first electric charge holding electrode 3 and the third electric charge holding electrode 5 may be omitted. When the omission is performed, either steps S301 and S302, or steps S303 and S304 can also be omitted. For this reason, time required to inspect the electric circuit 1 can be shortened.

A method of manufacturing a liquid crystal display according to a third embodiment will be described below. The method of manufacturing a liquid crystal display according to the third embodiment realizes a manufacturing method which suppresses a reduction in manufacturing yield by using a method of inspecting an electric circuit in the first or second embodiment.

Figure 11:
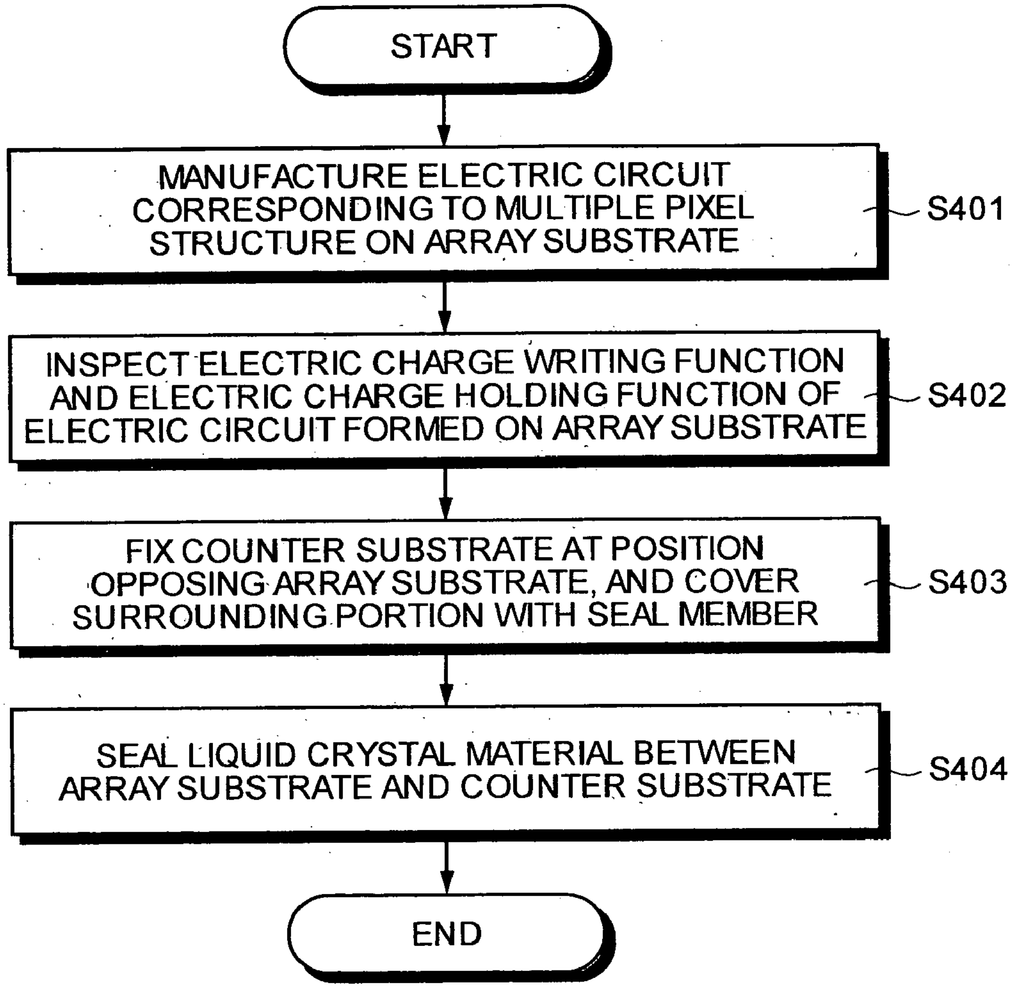
FIG. 11 is a flow chart for explaining a method of manufacturing a liquid crystal display according to a third embodiment.
Figure 12:
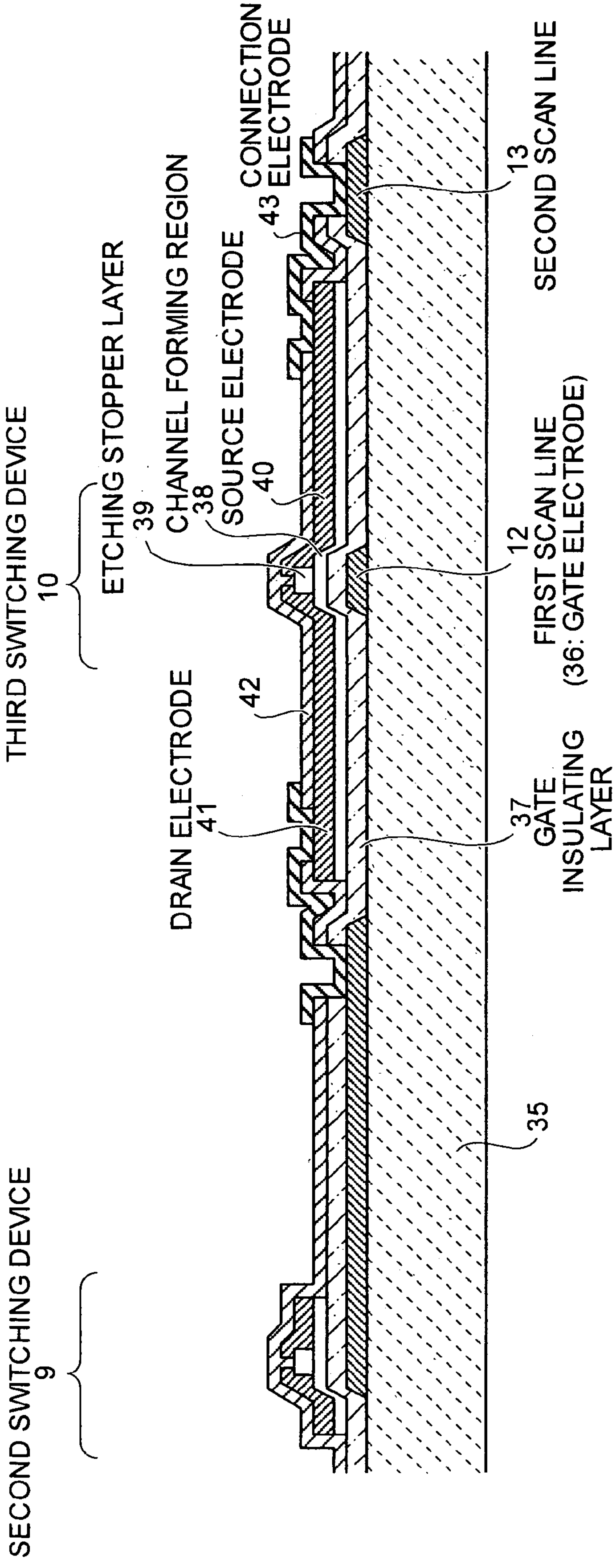
FIG. 12 is a typical diagram showing an example of a sectional structure of an electric circuit formed on an array substrate.
Figure 13:
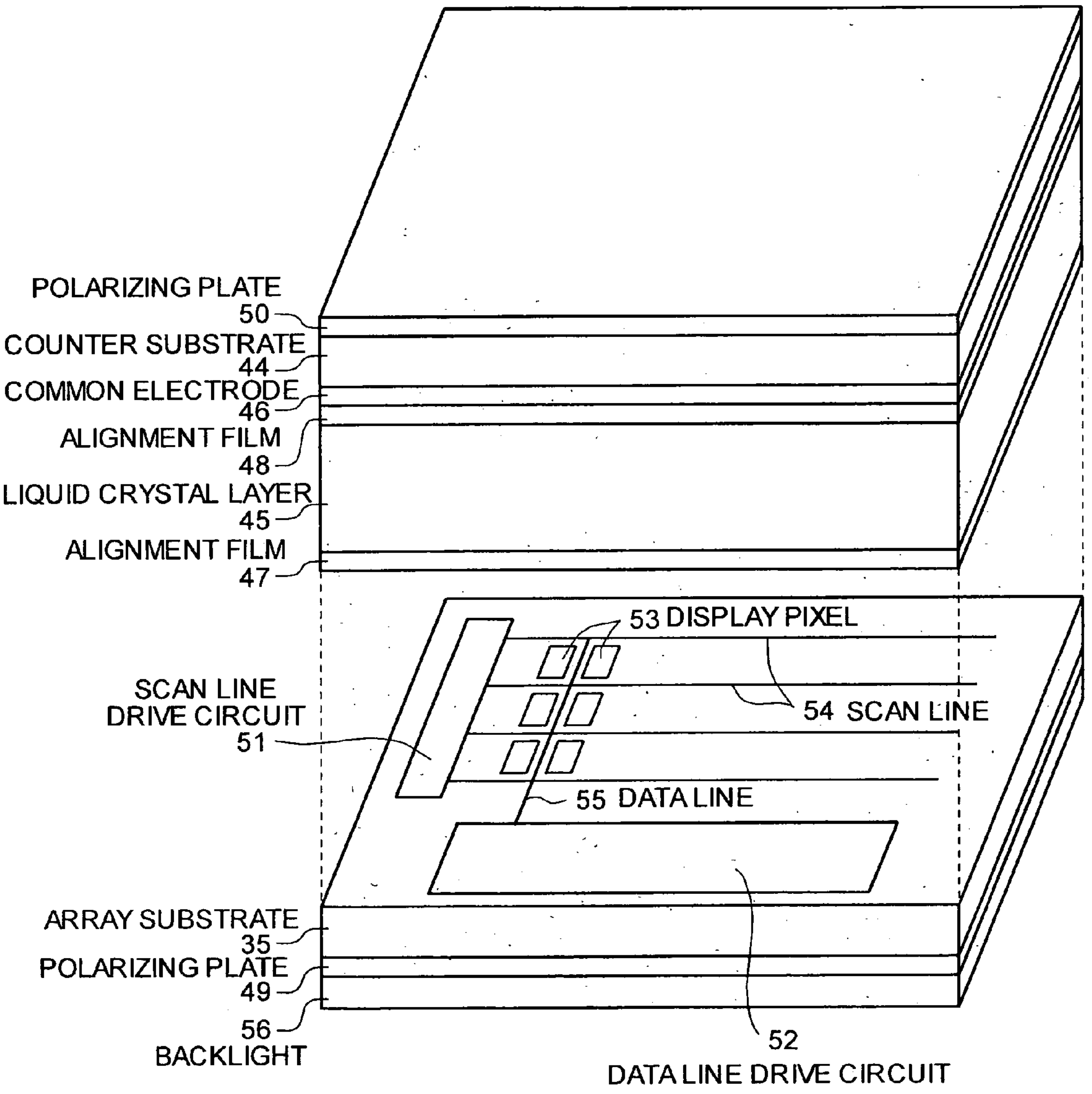
FIG. 13 is a typical diagram showing the structure of the liquid crystal display.
Figure 14:
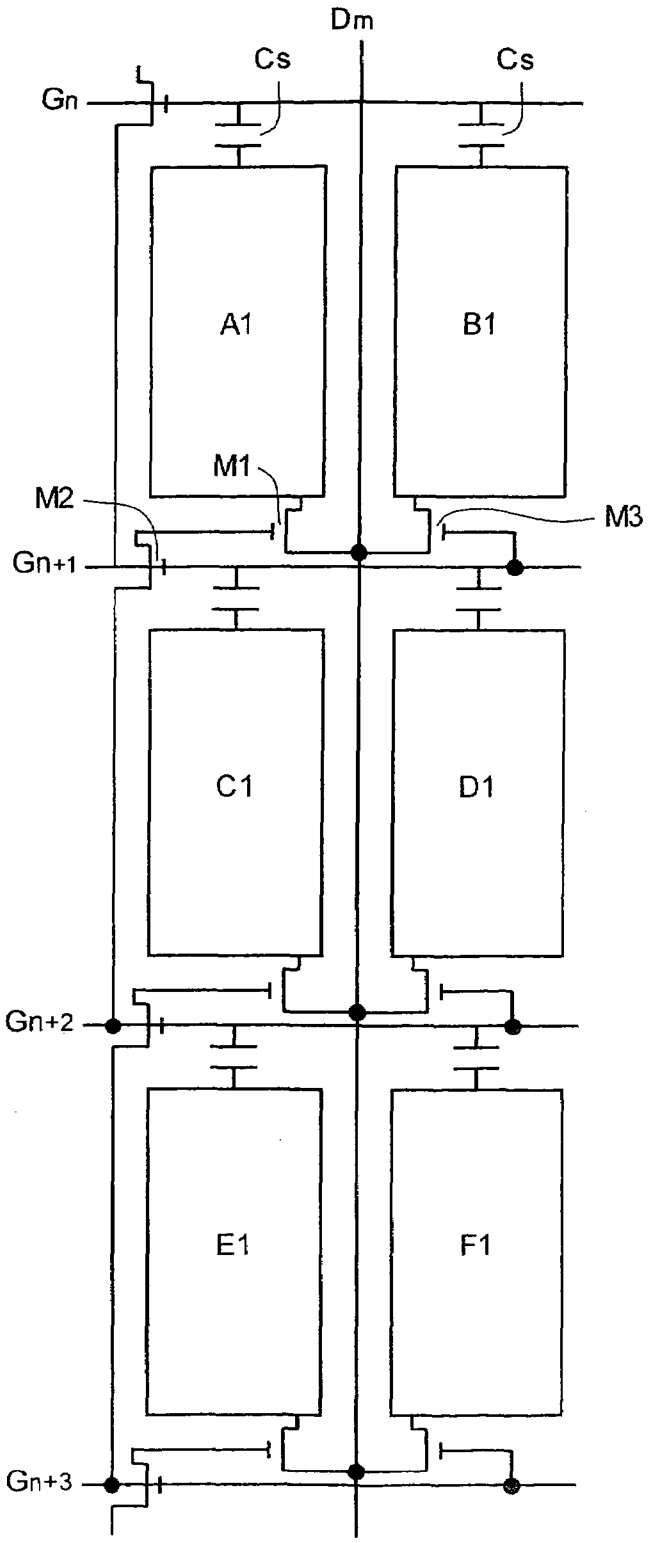
PRIOR ART FIG.14
FIG. 14 is an equivalent circuit diagram showing an example of the structure of a TFT array substrate constituting a liquid crystal display having a multiple pixel structure.

FIG. 11 is a flow chart for explaining the method of manufacturing a liquid crystal display according to the third embodiment. FIGS. 12 and 13 are reference diagrams for explaining the manufacturing method. The method of manufacturing a liquid crystal display according to the third embodiment will be described below with reference to FIGS. 11 to 13 accordingly.

An electric circuit corresponding to a multiple pixel structure is formed on an array substrate constituted by a transparent substrate such as a glass substrate (step S401). More specifically, a multi-layered structure of a predetermined pattern is formed on the array substrate by using a semiconductor process to form the electric circuit corresponding to a multiple pixel structure.

FIG. 12 is a sectional view showing a concrete structure of constituent elements of the electric circuit corresponding to the multiple pixel structure formed on the array substrate. As shown in FIG. 12, for example, a third switching device 10 has a structure in which a first scan line 12 (gate electrode 36), a gate insulating layer 37, and a channel forming region 38 are sequentially laminated in a predetermined pattern. On the channel forming region 38, an etching stopper layer 39, a source electrode 40, and a drain electrode 41 are laminated. On the upper surface of the resultant structure, a protecting film 42 is formed. In these layer structures, a material constituting the layer structure is uniformly laminated by a CVD (Chemical Vapor Deposition) method, a deposition method, a sputtering method, and the like for each layer. Thereafter, after a photoresist is uniformly coated on the resultant structure, a mask pattern corresponding to the pattern of the layer structure is formed by a photolithography method. An etching process such as chemical etching is performed by using the mask pattern as a mask to remove an unnecessary part, thereby forming the layer structure. These processes are repeated to the respective layers to form a structure shown in FIG. 12.

Thereafter, an electric charge writing function and an electric charge holding function related to the electric circuit formed on the array substrate are inspected (step S402). As the contents of a concrete inspection in this step, the contents described in the first embodiment or the second embodiment are performed. Since the details of the inspection have been described above, the details will be omitted in the following description.

A counter substrate is fixed at a position opposing the array substrate, a region between the array substrate and the counter substrate is covered by arranging a seal member on a surrounding portion of the array substrate (step S403). The liquid crystal display has a configuration in which a liquid crystal material is arranged in a region influenced by the electric circuit formed on the array substrate, and a relative positional relationship between the array substrate and the counter substrate is fixed such that the array substrate and the counter substrate has a predetermined interval, and the surrounding portion is covered with the seal member to assure a region in which the liquid crystal material is sealed. The seal member does not form a completely closed space in the region between the array substrate and the counter substrate, and the seal member is arranged to have a hole structure communicating with the outside at a part to seal the liquid crystal material.

Thereafter, the liquid crystal material is sealed between the array substrate and the counter substrate (step S404). In this step, after the region formed between the array substrate and the counter substrate is set in a vacuum state, the member formed in step S403 is dipped in a vessel holding the liquid crystal material to seal the liquid crystal material. Thereafter, a polarizing plate, a backlight, and the like are combined to each other to manufacture a liquid crystal display. FIG. 13 is a typical diagram showing the structure of the liquid crystal display. FIG. 13 shows an example of the structure of the liquid crystal display manufactured by the method of manufacturing a liquid crystal display according to the third embodiment.

As shown in FIG. 13, the liquid crystal display has a structure in which a liquid crystal line 45 constituted by a liquid crystal material is arranged between the array substrate 35 and the counter substrate 44. Although not shown in FIG. 13, in order to prevent the liquid crystal material constituting the liquid crystal line 45 from leaking, a seal member is actually arranged around the liquid crystal line 45. As a more preferable mode, an alignment film 47 is formed on the inner surface of the array substrate 35, and a common electrode 46 and an alignment film 48 are formed on the inner surface of the counter substrate 44. A polarizing plate 49 is formed on the outer surface of the array substrate 35, and a polarizing plate 50 is formed on the outer surface of the counter substrate 44. Furthermore, on the array substrate 35, after, e.g., step S404, a scan line drive circuit 51 and a data line drive circuit 52 are arranged and electrically connected to the electric circuit formed on the array substrate 35.

In the method of manufacturing a liquid crystal display according to the third embodiment, the method of inspecting an electric circuit according to the first embodiment or the second embodiment is used to make it possible to correctly detect electric charge writing functions and electric charge holding functions related to pixel electrodes (electric charge holding electrodes) formed on the array substrate 35. Therefore, a disadvantage of erroneously determining a product having a preferable electric charge writing function and a preferable electric charge holding function as a defective product can be prevented. In contrast to this, a problem of missing a defective pixel electrode can be suppressed. A disadvantage of making a defective portion clear after all the manufacturing steps are completed is suppressed.

The inspection step shown in step S402 can be performed after a liquid crystal material is completely sealed. However, when an inspection is performed after the assembling step is completed and a defective is detected, the steps performed up to new are wasted, and the counter substrate 44 or the like used in assembling must be wasted. Therefore, as a desired mode, an inspection is performed immediately after the electric circuit is formed on the array substrate 35.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit inspection method, comprising:

supplying electric charges to a first, second, and third electric charge holding electrodes, the first electric charge holding electrode being electrically connected to an output line when a predetermined drive voltage is supplied to a first scan line, the second electric charge holding electrode being electrically connected to the output line when a predetermined drive voltage is supplied to both the first scan line and a second scan line, the third electric charge holding electrode being electrically connected to the output line when a predetermined drive voltage is supplied to the second scan line;

outputting the electric charges held in the first electric charge holding electrode after a predetermined period of time from supplying of the electric charges;

changing voltages of the first and second scan lines to a drive voltage to output the electric charges held in the second electric charge holding electrode; and determining whether an electric charge writing function and an electric charge holding function of the second electric charge holding electrode are good or not based on (i) one of a quantity of the electric charges supplied to the second electric charge holding electrode and a quantity corresponding to the electric charges supplied to the second electric charge holding electrode, and (ii) a quantity of the electric charges output from the second electric charge holding electrode.

2. The circuit inspection method according to claim 1, further comprising outputting the electric charges held in the third electric charge holding electrodes after the predetermined period of time from supplying of the electric charges.

3. The circuit inspection method according to claim 2, further comprising:

detecting separately electric charges held in the first and third electric charge holding electrodes where a timing at which a voltage of the first scan line is changed into a drive voltage is different from a timing at which a voltage of the second scan line is changed into the drive voltage; and comparing the detected electric charges with one of a quantity of the supplied electric charges and a quantity corresponding to the supplied electric charges to determine whether electric charge writing functions and electric charge holding functions of the first, second, and third electric charge holding electrodes are good or not.

4. The circuit inspection method according to claim 1, wherein supplying of the electric charges includes supplying zero voltage to the third electric charge holding electrode, and outputting of the electric charges held in the first and third electric charge holding electrodes includes electric charges are not output from the third electric charge holding electrode.

5. The circuit inspection method according to claim 1, wherein supplying of the electric charges includes supplying electric charges to the third electric charge holding electrode without controlling an absolute value of electric charge.

6. The circuit inspection method as recited in claim 1 further comprising acting with respect to said circuit on the basis of said determining step.

7. A circuit inspection method, comprising:

detecting and storing electric charges of at least one of a first electric charge holding electrode and a third electric charge holding electrode, the first electric charge holding electrode being electrically connected to an output line when a predetermined drive voltage is supplied to a first scan line, the third electric charge holding electrode being electrically connected to the output line when a predetermined drive voltage is supplied to a second scan line;

supplying predetermined electric charges to a second electric charge holding electrode and at least one of the first electric charge holding electrode and the third electric charge holding electrode, the second electric charge holding electrode being electrically connected to the output line when a predetermined drive voltage is supplied to both the first scan line and the second scan line;

changing voltages of the first and second scan lines into a drive voltage after a predetermined period of time from supplying of the predetermined electric charges to drive switching devices and to output the electric charges held in the second electric charge holding electrode and the at least one of the first electric charge holding electrode and the third electric charge holding electrode; and determining an electric charge writing function and an electric charge holding function of the second electric charge holding electrode based on (i) the stored electric charges, (ii) the output electric charges, and (iii) one of a quantity of the supplied electric charges and a quantity corresponding to the supplied electric charges.

8. The circuit inspection method as recited in claim 7 further comprising acting with respect to said circuit on the basis of said determining step.

9. A method of manufacturing a liquid crystal display, comprising:

forming an electric circuit including a predetermined substrate, an output line, first and second scan lines, a first electric charge holding electrode which is electrically connected to the output line when a predetermined drive voltage is supplied to the first scan line, a second electric charge holding electrode which is electrically connected to the output line when a predetermined drive voltage is supplied to both the first and second scan lines, and a third electric charge holding electrode which is electrically connected to the output line when a predetermined drive voltage is supplied to the second scan line;

supplying electric charges to the first, second, and third electric charge holding electrodes;

outputting the electric charges held in the first electric charge holding electrode after a predetermined period of time from supplying of the electric charges;

changing voltages of the first and second scan lines to a drive voltage to output the electric charges held in the second electric charge holding electrode;

determining whether an electric charge writing function and an electric charge holding function of the second electric charge holding electrode are good or not based on (i) one of a quantity of the electric charges supplied to the second electric charge holding electrode and a quantity corresponding to the electric charges supplied to the second electric charge holding electrode, and (ii) a quantity of the electric charges output from the second electric charge holding electrode;

fixing a counter substrate at a position opposing the substrate; and sealing a liquid crystal material between the substrate and the counter substrate.

10. The liquid crystal display manufacturing method as recited in claim 9 further comprising acting with respect to said circuit on the basis of said determining step.

11. A method of manufacturing a liquid crystal display, comprising:

forming an electric circuit including a predetermined substrate, an output line, first and second scan lines, a first electric charge holding electrode which is electrically connected to the output line when a predetermined drive voltage is supplied to the first scan line, a second electric charge holding electrode which is electrically connected to the output line when a predetermined drive voltage is supplied to both the first and second scan lines, and a third electric charge holding electrode which is electrically connected to the output line when a predetermined drive voltage is supplied to the second scan line;

detecting and storing electric charges of at least one of the first electric charge holding electrode and the third electric charge holding electrode;

supplying predetermined electric charges to the second electric charge holding electrode and at least one of the first electric charge holding electrode and the third electric charge holding electrode;

changing voltages of the first and second scan lines into a drive voltage after a predetermined period of time from supplying of the predetermined electric charges to drive switching devices and to output the electric charges held in the second electric charge holding electrode and the at least one of the first electric charge holding electrode and the third electric charge holding electrode;

determining an electric charge writing function and an electric charge holding function of the second electric charge holding electrode based on (i) the stored electric charges, (ii) the output electric charges, and (iii) one of a quantity of the supplied electric charges and a quantity corresponding to the supplied electric charges;

fixing a counter substrate at a position opposing the substrate; and sealing a liquid crystal material between the substrate and the counter substrate.

12. The liquid crystal display manufacturing method as recited in claim 11 further comprising acting with respect to said circuit on the basis of said determining step.

13. A circuit inspection apparatus, comprising:

an electric charge supplying unit that supplies electric charges to a first, second, and third electric charge holding electrodes, the first electric charge holding electrode being electrically connected to an output line when a predetermined drive voltage is supplied to a first scan line, the second electric charge holding electrode being electrically connected to the output line when a predetermined drive voltage is supplied to both the first scan line and a second scan line, the third electric charge holding electrode being electrically connected to the output line when a predetermined drive voltage is supplied to the second scan line;

a scan line driving unit that changes voltages of the first and second scan lines to a drive voltage;

an electric charge detecting unit that derives the electric charges from the first electric charge holding electrode after a predetermined period of time from supplying of the electric charges by the electric charge supplying unit, and detects the electric charges held in the second electric charge holding electrode when the scan line driving unit changes the voltages of the first and second scan lines; and a determining unit that determines whether an electric charge writing function and an electric charge holding function of the second electric charge holding electrode are good or not based on (i) one of a quantity of the supplied electric charges and a quantity corresponding to the supplied electric charges, and (ii) a quantity of the electric charges output from the second electric charge holding electrode.

* * * * *